(12) United States Patent
Iriguchi et al.

(10) Patent No.: US 7,623,054 B2
(45) Date of Patent: Nov. 24, 2009

(54) DIFFERENTIAL AMPLIFIER, DIGITAL-TO-ANALOG CONVERTER, AND DISPLAY DEVICE

(75) Inventors: Masao Iriguchi, Tokyo (JP); Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 598 days.

(21) Appl. No.: 11/526,636

(22) Filed: Sep. 26, 2006

(65) Prior Publication Data
US 2007/0085608 A1    Apr. 19, 2007

(30) Foreign Application Priority Data
Sep. 27, 2005    (JP) .............................. 2005-280462

(51) Int. Cl.
*H03M 1/66* (2006.01)
(52) U.S. Cl. ...................................... 341/150; 330/253
(58) Field of Classification Search ......... 341/150–170; 330/51, 69, 252, 253, 255, 257, 258, 261, 330/297
See application file for complete search history.

(56) References Cited

U.S. PATENT DOCUMENTS

| | | | |
|---|---|---|---|
| 6,448,836 B2 | 9/2002 | Kokubun et al. | |
| 6,806,769 B2 * | 10/2004 | Imayama et al. | 330/252 |
| 7,443,234 B2 * | 10/2008 | Iriguchi | 330/9 |
| 7,459,967 B2 * | 12/2008 | Tsuchi et al. | 330/9 |
| 7,508,259 B2 * | 3/2009 | Tsuchi | 330/51 |

FOREIGN PATENT DOCUMENTS

JP    2001292041 A    10/2001
JP    2002-202748 A   7/2002

OTHER PUBLICATIONS

Design of Analog CMOS Integrated Circuits, Basic Edition, Mar. 30, 2003; pp. 173-180, translated by Tadahiro Kuroda.

* cited by examiner

*Primary Examiner*—Lam T Mai
(74) *Attorney, Agent, or Firm*—Foley & Lardner LLP

(57) ABSTRACT

Disclosed is a differential amplifier of a multi-level output type comprising a load circuit including a diode-connected first transistor with a source thereof connected to a power supply and a second transistor with a source thereof connected to the power supply and connected to a gate of the first transistor through a capacitor, a differential pair including a third transistor and a fourth transistor with sources thereof connected in common and drains thereof connected to drains of the first and second transistors, respectively, a current source for supplying a current to the differential pair, a first switch connected between a gate of the second transistor and a drain of the fourth transistor, an amplifier with an input thereof connected to a drain of the second transistor and an output thereof connected to an output terminal, a second switch connected between a gate of the fourth transistor and a first input terminal, a third switch connected between the gate of the fourth transistor and a third input terminal, a fourth switch connected between a gate of the third transistor and a second input terminal, and a fifth switch connected between the gate of the third transistor and the output terminal. Switching control between a first state where the first, second and fourth switches are turned on and the third and fifth switches are turned off and a second state where the first and second fourth switches are turned off and the third and fifth switches are turned on is performed.

20 Claims, 24 Drawing Sheets

VIN1, VIN2; INPUT TERMINAL   VOUT; OUTPUT TERMINAL   S1–S5; SWITCH   M1, M2, M3, M4, M9; TRANSISTOR
VDD; POWER SUPPLY TERMINAL   VBIAS; BIAS VOLTAGE SUPPLY TERMINAL   VSS; GROUND TERMINAL
COFF; CAPACITANCE ELEMENT   901; DIFFERENTIAL CIRCUIT   903; OUTPUT STAGE AMPLIFIER CIRCUIT
904; CURRENT SOURCE   PA; DIFFERENTIAL AMPLIFIER CIRCUIT OUTPUT
PB; OUTPUT STAGE AMPLIFIER CIRCUIT OUTPUT

VIN1, VIN2; INPUT TERMINAL    VOUT; OUTPUT TERMINAL    S1-S5; SWITCH    M1, M2, M3, M4, M9; TRANSISTOR
VDD; POWER SUPPLY TERMINAL    VBIAS; BIAS VOLTAGE SUPPLY TERMINAL    VSS; GROUND TERMINAL
Coff; CAPACITANCE ELEMENT    901; DIFFERENTIAL CIRCUIT    903; OUTPUT STAGE AMPLIFIER CIRCUIT
904; CURRENT SOURCE    PA; DIFFERENTIAL AMPLIFIER CIRCUIT OUTPUT
PB; OUTPUT STAGE AMPLIFIER CIRCUIT OUTPUT VIN1, VIN2; INPUT TERMINAL   VOUT; OUTPUT TERMINAL   S1-S5; SWITCH   M21, M22, M23, M24, M29; TRANSISTOR
VDD; POWER SUPPLY TERMINAL   VBIAS; BIAS VOLTAGE SUPPLY TERMINAL   VSS; GROUND TERMINAL
COFF; CAPACITANCE ELEMENT   901; DIFFERENTIAL CIRCUIT   903; OUTPUT STAGE AMPLIFIER CIRCUIT
904; CURRENT SOURCE   PA; DIFFERENTIAL AMPLIFIER CIRCUIT OUTPUT
PB; OUTPUT STAGE AMPLIFIER CIRCUIT OUTPUT TDATA; ONE DATA OUTPUT PERIOD
T01; OFFSET DETECTION PERIOD
T02; OFFSET COMPENSATION OUTPUT PERIOD VIN1, VIN2; INPUT VOLTAGE    VOUT; OUTPUT VOLTAGE    TDATA; ONE DATA OUTPUT PERIOD
T01; OFFSET DETECTION PERIOD    T02; OFFSET COMPENSATION OUTPUT PERIOD

PERIOD T01

Id-Vg CHARACTERISTICS DURING OFFSET DETECTION PERIOD T01

PERIOD T02

Id-Vg CHARACTERISTICS DURING OFFSET COMPENSATION OUTPUT PERIOD T02

RELATIONSHIPS BETWEEN INPUT AND OUTPUT LEVELS

| OUTPUT LEVEL | INPUT VOLTAGE | Vin1 | Vin2 | D1,D0 |
|---|---|---|---|---|
| Vo1 |   | B | A | 0,0 |
| Vo2 | A | A | A | 0,1 |
| Vo3 | B | B | B | 1,0 |
| Vo4 |   | A | B | 1,1 |

RELATIONSHIPS OF VOLTAGE SELECTION STATES ASSOCIATED WITH TWO-BIT DIGITAL DATA (D1, D0)

301; RESISTANCE ELEMENT   302; SWITCHES   303; DIFFERENTIAL AMPLIFIER

VIN1, VIN2, VIN3; INPUT TERMINAL  VOUT; OUTPUT TERMINAL  S1-S5; SWITCH  M1, M2, M3, M4, M9; TRANSISTOR
VDD; POWER SUPPLY TERMINAL  VBIAS; BIAS VOLTAGE SUPPLY TERMINAL  VSS; GROUND TERMINAL
M1-M10; TRANSISTOR  901; DIFFERENTIAL CIRCUIT  903; OUTPUT STAGE AMPLIFIER CIRCUIT
904; CURRENT SOURCE  PA; DIFFERENTIAL AMPLIFIER CIRCUIT OUTPUT
PB; OUTPUT STAGE AMPLIFIER CIRCUIT OUTPUT

TDATA; ONE DATA OUTPUT PERIOD

T01; OFFSET DETECTION PERIOD

T02; OFFSET COMPENSATION OUTPUT PERIOD

VIN1, VIN2, VIN3; INPUT VOLTAGE   VOUT; OUTPUT VOLTAGE   TDATA; ONE DATA OUTPUT PERIOD
T01; OFFSET DETECTION PERIOD   T02; OFFSET COMPENSATION OUTPUT PERIOD

VIN1, VIN2: INPUT TERMINAL    VOUT: OUTPUT TERMINAL    S1-S5: SWITCH    M1, M2, M3, M4, M9, M11, M12: TRANSISTOR
VDD: POWER SUPPLY TERMINAL    VBIAS, VBIAS2: BIAS VOLTAGE SUPPLY TERMINAL    VSS: GROUND TERMINAL
COFF: CAPACITANCE ELEMENT    901: DIFFERENTIAL CIRCUIT    903: OUTPUT STAGE AMPLIFIER CIRCUIT
904: CURRENT SOURCE    PA: DIFFERENTIAL AMPLIFIER CIRCUIT OUTPUT
PB: OUTPUT STAGE AMPLIFIER CIRCUIT OUTPUT

FIG . 12

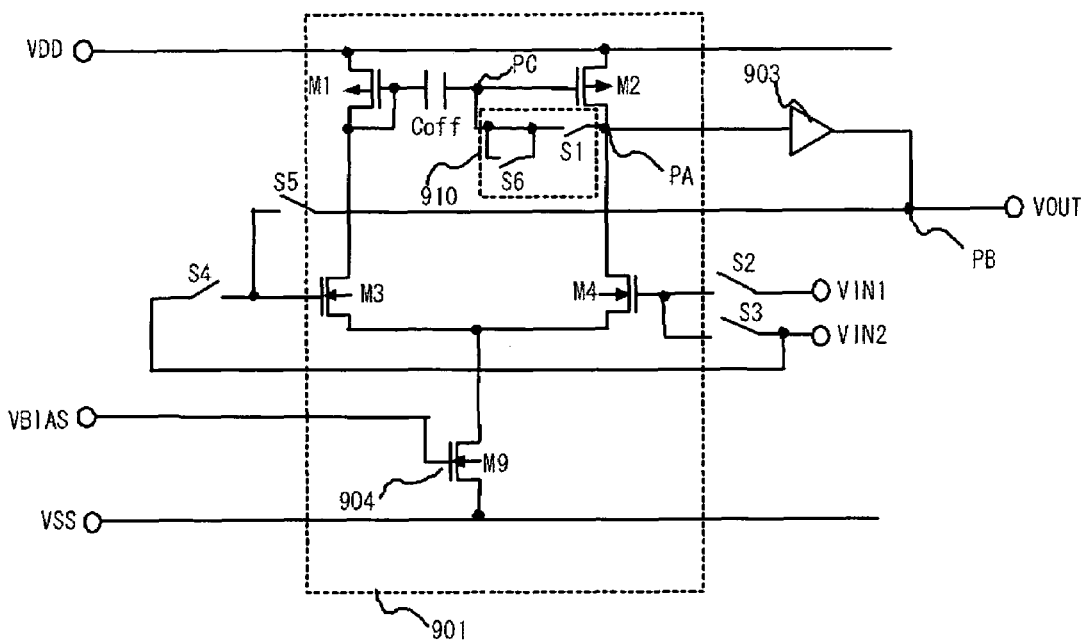

VIN1, VIN2; INPUT TERMINAL   VOUT; OUTPUT TERMINAL   S1-S5; SWITCH   M1, M2, M3, M4, M9, TRANSISTOR
VDD; POWER SUPPLY TERMINAL   VBIAS; BIAS VOLTAGE SUPPLY TERMINAL   VSS; GROUND TERMINAL
COFF; CAPACITANCE ELEMENT   901; DIFFERENTIAL CIRCUIT   903; OUTPUT STAGE AMPLIFIER CIRCUIT
904; CURRENT SOURCE   910; SWITCH CIRCUIT   PA; DIFFERENTIAL AMPLIFIER CIRCUIT OUTPUT
PB; OUTPUT STAGE AMPLIFIER CIRCUIT OUTPUT   PC; CAPACITANCE Coff END NODE

PMOS SWITCH CIRCUIT

NMOS SWITCH CIRCUIT

CMOS SWITCH CIRCUIT

VIN1, VIN2; INPUT TERMINAL   VOUT; OUTPUT TERMINAL   S1-S5, S7; SWITCH   M1, M2, M3, M4, M9, M59; TRANSISTOR
VDD; POWER SUPPLY TERMINAL   VBIAS; BIAS.VOLTAGE SUPPLY TERMINAL   VSS; GROUND TERMINAL
COFF; CAPACITANCE ELEMENT   901; DIFFERENTIAL CIRCUIT   903; OUTPUT STAGE AMPLIFIER CIRCUIT
904; CURRENT SOURCE   PA; DIFFERENTIAL AMPLIFIER CIRCUIT OUTPUT
PB; OUTPUT STAGE AMPLIFIER CIRCUIT OUTPUT

VIN; INPUT TERMINAL    VOUT; OUTPUT TERMINAL
VDD; POWER SUPPLY TERMINAL    VBIAS; BIAS VOLTAGE SUPPLY TERMINAL
VSS; GROUND TERMINAL   M1-M10; TRANSISTOR   901; DIFFERENTIAL STAGE CIRCUIT
903; OUTPUT STAGE AMPLIFIER CIRCUIT    PA; DIFFERENTIAL STAGE OUTPUT
PB; OUTPUT STAGE AMPLIFIER CIRCUIT OUTPUT 801, 802, 803 (S1, S2, S3); SWITCH    810; OP-AMP
811; OFFSET CANCEL CIRCUIT    COFF; OFFSET DETECTING CAPACITANCE

TDATA; ONE DATA OUTPUT PERIOD
T01; OFFSET DETECTION PERIOD
T02; OFFSET COMPENSATION OUTPUT PERIOD

FIG. 18    PRIOR ART

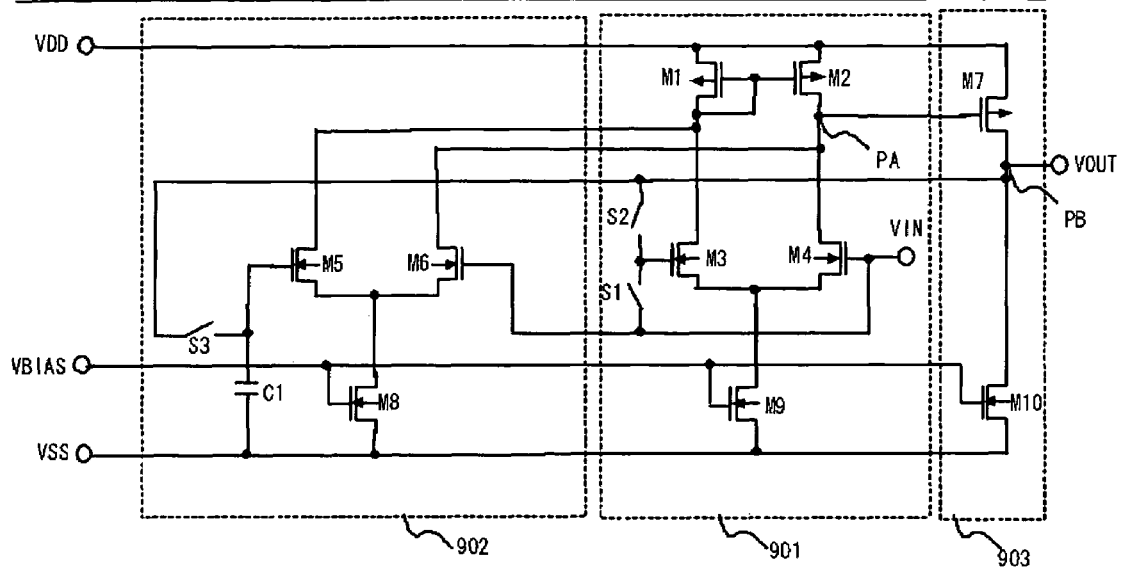

PATENT DOCUMENT 1 (FIRST EMBODIMENT DESCRIBED IN JP PATENT KOKAI PUBLICATION NO. JP-P2001-292041A)

VIN; INPUT TERMINAL    VOUT; OUTPUT TERMINAL
VDD; POWER SUPPLY TERMINAL    VBIAS; BIAS VOLTAGE SUPPLY TERMINAL    VSS; GROUND TERMINAL
S1, S2, S3; SWITCH    C1; CAPACITANCE    M1-M10; TRANSISTOR
901; DIFFERENTIAL CIRCUIT    902; OFFSET CANCEL CIRCUIT    903; OUTPUT STAGE AMPLIFIER CIRCUIT
PA; DIFFERENTIAL AMPLIFIER CIRCUIT OUTPUT    PB; OUTPUT STAGE AMPLIFIER CIRCUIT OUTPUT

TDATA, ONE DATA OUTPUT PERIOD
T01; OFFSET DETECTION PERIOD
T02; OFFSET COMPENSATION OUTPUT PERIOD

VIN1, VIN2; INPUT TERMINAL    VOUT; OUTPUT TERMINAL    S1-S3; SWITCH    M1, M2, M3, M4, M9; TRANSISTOR
VDD; POWER SUPPLY TERMINAL    VBIAS; BIAS VOLTAGE SUPPLY TERMINAL    VSS; GROUND TERMINAL
COFF; CAPACITANCE ELEMENT    M1-M10; TRANSISTOR    901; DIFFERENTIAL CIRCUIT
903; OUTPUT STAGE AMPLIFIER CIRCUIT    PA; DIFFERENTIAL AMPLIFIER CIRCUIT OUTPUT
PB; OUTPUT STAGE AMPLIFIER CIRCUIT OUTPUT

TDATA; ONE DATA OUTPUT PERIOD

T01; OFFSET DETECTION PERIOD

T02; OFFSET COMPENSATION OUTPUT PERIOD

201; AMPLIFIER  202; OUTPUT CIRCUIT  203; DECODER
205; GRAY SCALE VOLTAGE GENERATION CIRCUIT
206; LEVEL SHIFTER  207; DATA LATCH  208; DATA REGISTER
209; SHIFT REGISTER  210; DATA DRIVER OUTPUT TERMINALS

601; POSITIVE POLARITY OUTPUT DIFFERENTIAL AMPLIFIER
602; NEGATIVE POLARITY OUTPUT DIFFERENTIAL AMPLIFIER
603; OUTPUT CIRCUIT   604; OUTPUT SWITCH CIRCUIT   605; DECODER
205; GRAY SCALE VOLTAGE GENERATION CIRCUIT   206; LEVEL SHIFTER
207; DATA LATCH   208; DATA REGISTER   209; SHIFT REGISTER   210; DATA DRIVER OUTPUT TERMINALS
Spa, Spb, Sna, Snb; OUTPUT SWITCH   OUT1-OUTn; OUTPUT TERMINAL

TDATA; ONE DATA OUTPUT PERIOD
T01; OFFSET DETECTION PERIOD   T02; OFFSET COMPENSATION OUTPUT PERIOD

US 7,623,054 B2

DIFFERENTIAL AMPLIFIER, DIGITAL-TO-ANALOG CONVERTER, AND DISPLAY DEVICE

FIELD OF THE INVENTION

The present invention relates to a differential amplifier, a digital-to-analog converter, and a display device. More specifically, the invention relates to a differential amplifier suitable for use as the differential amplifier of a multi-level output type having an offset canceling function, and a digital-to-analog converter and a display device both having the differential amplifier.

BACKGROUND OF THE INVENTION

As a conventional typical data driver that drives a data line in a liquid crystal display device, a configuration as shown in FIG. 22 is employed. Referring to FIG. 22, this data driver includes a shift register 209, a data register 208, a data latch 207, a level shifter 206, a gray scale voltage generation circuit 205, decoders 203, and an output circuit 202 (amplifiers 201).

An operation of the data driver shown in FIG. 22 will be described. The shift register 209 outputs a shift pulse responsive to a clock signal CLK. The data register 208 sequentially shifts up input video data DATA_IN responsive to the shift pulse from the shift register 209, and distributes the video data according to the number of outputs. The data latch 207 temporarily holds the video data distributed by the data register 208 and outputs all the outputs to the level shifter 206 in unison responsive to a timing of a control signal STB.

A signal output from the level shifter 206 is a digital video signal. This digital signal is converted to an analog gray scale voltage from the digital video signal by circuits from a decoder 203 to the output circuit 202. The gray scale voltage generation circuit 205 is constituted from a resistance string connected between a power supply VA and a power supply VB. From respective terminals (taps) of the resistance string, gray scale voltages corresponding to the number of gray scales are output to the decoders 203 (gray scale voltage selection circuits). Through input of each gray scale voltage and the digital video signal, the decoder 203 selects the gray scale voltage corresponding to the digital video signal, for output to the output circuit 202. The output circuit 202 amplifies the gray scale voltage, for output to each of output terminals 210. Each of the output terminals 210 is connected to one end of a data line for supplying the gray scale voltage to a pixel in the display device.

The decoders 203 and the amplifiers 201 each for outputting the gray scale voltage corresponding to the digital video signal are provided for each of the number of the outputs. Further, the respective gray scale voltages output from the gray scale voltage generation circuit 205 are shared by all of the outputs through gray scale voltage lines.

That is, the decoders 203, gray scale voltage generation circuit 205, and output circuit 202 constitute a digital-to-analog conversion circuit block.

Generally, each data line in the liquid display device is a heavy capacitive load. Thus, as the amplifier in the output circuit 202, an OP amplifier (operational amplifier, referred to as an "op-amp") is employed. The op-amp as shown in FIG. 15, for example, includes a differential stage circuit 901 and an output stage amplifier circuit 903. The differential circuit (differential stage circuit) 901 includes a differential pair constituted from NMOS transistors M3 and M4 with sources thereof connected in common, a current mirror circuit constituted from PMOS transistors M1 and M2, and an NMOS transistor M9 that serves as a constant current source when a constant bias voltage is applied to a gate terminal thereof. In an example in FIG. 15, the amplifier circuit of an active load type with a source thereof grounded is constructed in the output stage amplifier circuit 903, which includes a PMOS transistor M7 for receiving an output signal from an output point PA of the differential stage circuit and for amplifying the signal and an MOS transistor M10 that serves as a constant current source.

A negative feedback is formed by connection between a node PB and an input to a gate of the transistor M3. Accordingly, a voltage at an output terminal (voltage at an output point PB) is stabilized at a potential at which a drain current of the PMOS transistor M7 of the output stage amplifier circuit that flows in response to a differential amplification output signal and a drain current of the transistor M10 as the constant current source is balanced.

However, in the op-amp, there is a problem that an output offset is generated mainly due to characteristic variations in active devices. As a cause of these characteristic variations, variations in oxide films of the MOS transistors, variations in impurity concentrations of the MOS transistors, variations in device sizes (W/L, where W indicates a channel width and L indicates a channel length), or the like are present. These fabrication variations are determined according to whether a fabrication process was satisfactory or not, which is an unavoidable problem.

Generally, an offset voltage caused by the characteristic variations of the transistors in the portion of the differential circuit is proportional to $1/\sqrt{S}$ when a transistor gate area is set to S. Thus, in order to reduce the offset voltage, the gate area must be set to be considerably large. This causes a chip area to become large and has its own limit when the offset voltage itself is large. Then, in order to solve this problem, a circuit (offset canceling amplifier) for compensating for the output offset that uses a capacitance element is employed.

FIG. 16 shows an example of a typical configuration of the offset canceling amplifier that has been conventionally used. FIG. 17 is a timing chart showing a control method over the offset canceling amplifier in FIG. 16. Referring to FIG. 16, an offset cancel circuit 811 includes an offset detecting capacitor Coff and switches 801 to 803. A voltage Vin at an input terminal VIN of an op-amp 810 is applied to a non-inverting input terminal (+) of the op-amp 810. An output terminal VOUT of the op-amp 810 drives a load (not shown) to be output to an outside and connected to the outside.

Next, an operation of the offset canceling amplifier shown in FIG. 16 will be described using the timing chart in FIG. 17. Referring to FIG. 17, reference numeral S1 corresponds to the switch 801, reference numeral S2 corresponds to the switch 802, and reference numeral S3 corresponds to the switch 803. As shown in FIG. 17, one data output period includes two periods constituted from an offset detection period T01 and an offset compensation output period T02.

During the offset detection period T01, the switches S1 and S2 are set in an ON state, and the switch S3 is set in an OFF state. With this arrangement, one end of the capacitor Coff is connected to the input terminal VIN, and a potential of the capacitor Coff is set to an input potential Vin. Since the switch S1 is in an on stage, a potential at the other end of the capacitor Coff is set to an output voltage Vout. Accordingly, a voltage to be applied to the capacitor Coff becomes as follows:

$$Vout - Vin = (Vin + Voff) - Vin = Voff$$

Electrical charges corresponding to an offset voltage Voff are charged to the capacitor Coff (in the offset detection period).

During the offset compensation output period T02, the switches S1 and S2 are set in an OFF state, and then the switch S3 is set in an ON state. By turning off the switches S1 and S2, the offset voltage Voff is maintained in the capacitor Coff. By turning on the switch S3, an inverting input terminal of the op-amp 810 operates to subtract only a voltage corresponding to the offset voltage Voff from to the output voltage Vout during the period T01. As a result, the output voltage Vout becomes as follows:

$$Vout = (Vin + Voff) - Voff = Vin$$

Thus, the offset voltages are compensated for, so that a high accuracy voltage can be output (in the offset compensation output period).

However, the conventional offset canceling amplifier described with reference to FIGS. 16 and 17 has the following problem.

That is, the input terminal VIN is connected to the one end of the capacitor Coff in the period T01. Thus, an effective input capacitance of the amplifier increases. The smaller the input capacitance of the amplifier is, the less power consumption is required.

On the other hand, the offset detecting capacitor Coff needs to be of an appropriate and certain size so as to maintain the voltage for a predetermined period and also minimize an offset error caused by electric charges generated at a time of switching off.

Further, in the case of the offset canceling amplifier shown in FIG. 16, the input terminal VIN and the output terminal VOUT are connected through the capacitor Coff in the period T01 to form a positive feedback loop. Accordingly, when a supply capacity of an external power supply for supplying the voltage to the input terminal is small, an output potential may become unstable. For the reason described above, it is not advisable to connect the capacitance element to the input terminal VIN of the amplifier.

Further, in a case of a TFT (thin film transistor) circuit manufactured by a low-temperature polysilicon process, threshold value variations of respective transistors constituting the circuit are extremely large. Thus, in the offset canceling amplifier in FIG. 16, an offset cannot be compensated for completely. Thus, an output deviation may remain, or the circuit may not operate.

As an offset canceling amplifier capable of solving an increase in the input capacitance and a problem on a circuit operation, the amplifier described in Patent Document 1 (JP Patent Kokai Publication No. JP-P2001-292041A) is known. FIG. 18 shows a circuit configuration of the offset canceling amplifier disclosed in Patent Document 1, and FIG. 19 shows a timing chart showing a control method thereof.

An operation of the offset canceling amplifier described in Patent Document 1 will be described below, using the circuit configuration in FIG. 18 and the timing chart in FIG. 19. During the offset detection period T01 of one data output period TDATA, switches S1 and S3 are set in an ON state and a switch S2 is set in an OFF state. In this case, a voltage Vin supplied to an input terminal VIN is supplied to both of a differential pair (constituted from transistors M3 and M4). Thus, the differential pair (constituted from the transistors M3 and M4) operates as a current source for a current mirror circuit (constituted from transistors M1 and M2). In a differential pair (constituted from transistors M5 and M6), the input terminal VIN is connected to a gate of the transistor M6, and an output terminal VOUT is connected to a gate of the transistor M5. At this point, the output terminal voltage Vout is stabilized at a voltage (Vin+Voff) including an offset voltage Voff caused by a characteristic deviation of the transistors within a differential circuit due to a negative feedback operation. In this case, a capacitor C1 is connected to the gate of the transistor M5. Thus, a potential of the voltage Vout in the stabilized state is set in the capacitance.

Next, during the offset compensation output period T02, the switches S1 and S3 are set in an OFF state, and the switch S2 is set in an ON state. In this case, the same voltage as that in the period T01 is kept to be input to the differential pair (constituted from the transistors M5 and M6). Further, the output terminal VOUT is negative feedback connected to a gate of the transistor M3 with a gate of the transistor M4 kept connected to the input terminal. Thus, the output voltage Vout is stabilized at a potential that makes the offset canceling amplifier maintain the same state as that in the period T01. That is, in the period T02, the voltage Vout becomes the voltage Vin, so that the offset is compensated for.

An example of the offset canceling amplifier in Patent Document 1 is excellent in that there is no increase in the input capacitance due to addition of an offset cancel circuit and that operation stability is satisfactory because the capacitance element for offset detection is not connected to the input terminal VIN of the amplifier.

Compared with FIG. 20, the offset canceling amplifier in Patent Document 1 includes the two differential pairs.

On the other hand, as an example of the offset canceling amplifier including one differential pair, there is provided the amplifier described in Patent Document 2. FIG. 20 shows a circuit configuration thereof, and FIG. 21 shows a timing chart showing a control method thereof.

An operation of the offset canceling amplifier described in Patent Document 2 will be described below with reference to the circuit configuration in FIG. 20 and the timing chart in FIG. 21. During an offset detection period T01 of one data output period TDATA, switches S1 and S2 are set in an ON state, while a switch S3 is set in an OFF state. In this case, the same voltage value (Vin: at the input terminal VIN) is supplied to each gate of the differential pair (constituted from transistors M3 and M4). Since each of transistors M1 and M2 is a diode-connected transistor (with a gate thereof and a drain thereof short-circuited), a current that flows through the transistor M3 is converted and output as a gate voltage of the transistor M1, while a current that flows through the transistor M4 is converted and output as a gate voltage of the transistor M2. In this case, a difference between the gate voltages of the transistors M1 and M2 is set in a capacitor Coff.

Ideally, when characteristics of the transistors M1 and M2 in a differential circuit are completely the same and characteristics of the transistors M3 and M4 are completely the same, no offset is generated in an output of the differential circuit, and voltages at both ends of the capacitance element Coff becomes 0V. However, actually, the characteristics of the respective transistors vary due to fabrication variations or the like. The offset is thereby caused, and a voltage corresponding to the offset is set in the capacitance element Coff.

Next, during an offset compensation output period T02, the switches S1 and S2 are set in an OFF state, and the switch S3 is set in an ON state. In this case, the transistors M1 and M2 form a current mirror through the capacitor Coff, the input voltage VIN is connected to the gate of the transistor M4, and the output voltage VOUT is connected to the gate of the transistor M3. Thus, a voltage follower circuit is formed. When a transition from the period T01 to the period T02 is made, the offset voltage of the differential circuits is set to the capacitor Coff. Thus, the gate input voltage of the transistor M1 is different from the gate input voltage of the transistor M2 by a voltage corresponding to the offset voltage. In the period T02, this voltage difference operates to compensate for the offset, so that the voltage VOUT becomes equal to the voltage Vin during the period T02. With regard to quantitative analysis of these offset voltages, a description in paragraphs [0039] to [0043] in Patent Document 2 is referred to.

In the configuration disclosed in Patent Document 2 as well, the capacitance element of an offset detection amount is not connected to the input terminal VIN of the amplifier. Thus, this configuration is excellent in that there is no increase in the input capacitance caused by addition of an offset canceling function.

[Patent Document 1] JP Patent Kokai Publication No. JP-P2001-292041A

[Patent Document 2] JP Patent Kokai Publication No. JP-P2002-202748A

[Non-patent Document 1] "Design of Analog CMOS Integrated Circuits", Basic Edition, pp. 173-180, translated by Tadahiro Kuroda

SUMMARY OF THE DISCLOSURE

In recent years, in order to attain satisfactory display quality, the implementation of multiple gray scale levels (multi colors) has been under progress in liquid crystal display devices. When a six-bit digital video signal is handled, 64 gray-scale (260 thousand color) display is possible. When an eight-bit digital video signal is handled, 256 gray-scale (16800 thousand color) display is possible. Further, when a 10-bit digital video signal is handled, multiple gray scale display of gray scales as many as 1024 (1,0070,000 thousand color) is possible. However, in order to implement these multiple gray scales, the number of gray scale voltage lines corresponding to the number of gray scales becomes necessary in the configuration of the data driver as shown in FIG. 22. Further, there is a problem that the number of transistors for selecting gray scale voltages also increases, and the decoder area increases, so that die cost increases (first problem). There is also a problem that with the progress of multiple gray scale levels, a voltage between adjacent gray scale levels is reduced, so that more accurate output is required (second problem). In the case of a circuit formed of TFTs (thin-film transistors) in particular, deterioration of an output accuracy caused by the fabrication variations becomes more marked, as compared with a circuit formed of transistors fabricated on single crystal silicon.

Highly accurate output becomes possible by the offset canceling amplifier in Patent Document 1 in order to meet a demand for the highly accurate output described above. However, as shown in FIG. 18, two constant current sources (constituted from transistors M8 and M9) for supplying currents to the two differential pairs, respectively, become necessary. Thus, there is a problem that power consumption increases more than in the case of one differential pair (third problem). On contrast therewith, in the case of the offset canceling amplifier in Patent Document 2, one differential pair suffices, as shown in FIG. 20. Thus, there is an advantage that the highly accurate output is implemented and that there is no increase in power.

However, the amplifiers in Patent Document 1 and Patent Document 2 cannot solve the first problem of the increase in the die cost caused by the creation of multiple gray scales. In order to solve the first problem, a multi-level output amplifier that can output a large number of output levels using the less number of levels becomes necessary.

Accordingly, it is an object of the present invention to realize a differential amplifier of a multi-level output type, capable of providing high-accuracy output using low power.

A further of the present invention is to provide a digital-to-analog converter and a display device, each of which includes a differential amplifier capable of providing high-accuracy output using low power and reduce the decoder area.

The above and other objects are attained by the present invention which is configured as follows. Reference numerals and symbols within brackets in configurations that will be described below indicate corresponding numerals and symbols in embodiments of the invention and are strictly for the purpose of clarifying corresponding relationships thereof and do not limit the present invention.

A differential amplifier according to one aspect of the present invention includes:

first and second input terminals and an output terminal;

a differential pair (transistors M3 and M4) having a pair of inputs thereof connected to said first terminal and said second input terminal, respectively, said differential pair for performing voltage-to-current conversion of voltages at said first and second input terminals to output differential currents to first and second nodes, respectively;

a first current source (transistor M9) for supplying a current to the differential pair;

a first load circuit (transistor M1) connected to the first node, for performing current-to-voltage conversion of a current at the first node to a voltage at a third node;

a second load circuit (transistor M2) connected to the second node, for reversibly performing mutual conversion between a current at the second node and a voltage at a fourth node and for supplying a voltage signal to a fifth node;

a capacitance element (Coff) connected between the third node and the fourth node; and an amplifier circuit (903) for charging and discharging the output terminal based on the voltage signal at the fifth node.

Responsive to a control signal (a control signal for switches S1, S2, S3, S4, and S5), the differential amplifier is subjected to switching control between first and second states.

In the first state, a first signal (Vin2) is supplied to the first input terminal;

a second signal (Vin1) is supplied to the second input terminal; and a potential difference between the voltages output to the third and fourth nodes by the first and second load circuits (transistors M1 and M2), respectively, are stored in the capacitance element (Coff).

In the second state, a third signal (Vin3) is supplied to the second input terminal;

a signal (Vout) at the output terminal is fed back to the first input terminal; and the potential difference of the capacitance element (Coff) stored in the first state is held and a voltage signal is output to the fifth node based on the potential difference.

In a differential amplifier according to the present invention, a data output period includes first and second periods (T01 and T02).

In the first period (T01), a first signal (Vin2) is supplied to the first input terminal of the differential pair through a fourth switch (S4) in an on state;

a second signal (Vin1) is supplied to the second input terminal of the differential pair through a second switch (S2) in an ON state;

the second and fourth nodes are short-circuited by a first switch (S1) in an ON state; and a voltage between the third and fourth nodes is stored in the capacitance element (Coff).

In the second state (T02), the first, second, and fourth switches (S1, S2, and S4) are all turned off;

the output terminal (VOUT) is feedback connected to the first input terminal of the differential pair through a fifth switch (S5) in an ON state; and a third signal (Vin3) is supplied to the second input terminal of the differential pair through a third switch (S3) in an ON state.

A differential amplifier according to one aspect of the present invention includes:

first and second input terminals and an output terminal;

a differential pair (transistors M3 and M4) having a pair of inputs thereof connected to the first and second input terminals, respectively, the differential amplifier performing voltage-to-current conversion of voltages at the first and second input terminals to output differential currents to first and second nodes, respectively;

a first current source (transistor M9) for supplying a current to the differential pair;

a first load circuit (transistor M1) connected to the first node, for performing current-to-voltage conversion of a current at the first node to a voltage at a third node;

a second load circuit (transistor M2) connected to the second node, for reversibly performing mutual conversion between a current at the second node and a voltage at a fourth node and also supplying a voltage signal to a fifth node;

a capacitance element (Coff) connected between the third node and the fourth node; and an amplifier circuit (903) for charging and discharging the output terminal based on the voltage signal at the fifth node.

Responsive to a control signal (control signal for switches S1, S2, S3, S4, and S5), the differential amplifier is subjected to switching control between first and second states.

In the first state, a first signal (Vin2) is supplied to the first input terminal;

a second signal (Vin1) is supplied to the second input terminal; and a potential difference between the voltages at the third and fourth nodes output by the first and second load circuits, respectively, is stored in the capacitance element.

In the second state, the first signal (Vin2) is supplied to the second input terminal;

a signal (Vout) at the output terminal is fed back to the first input terminal; and the potential difference of the capacitance element stored in the first state is held and the voltage signal is output to the fifth node based on the potential difference.

In a differential amplifier according to the present invention, a data output period includes first and second periods (T01 and T02).

In the first period (T01), a first signal (Vin2) is supplied to the first input terminal of the differential pair through a fourth switch (S4) in an on state;

a second signal (Vin1) is supplied to the second input terminal of the differential pair through a second switch (S2) in an ON state;

the second and fourth nodes are short-circuited by a first switch (S1) in an ON state; and a voltage between the third node and the fourth node is held by the capacitance element (Coff).

In the second period (T02), the first, second, and fourth switches (S1, S2, and S4) are all turned off;

the output terminal (VOUT) is feedback connected to the first input terminal of the differential pair through a fifth switch (S5) in an ON state; and the first signal (Vin2) is supplied to the second input terminal of the differential pair through a third switch (S3) in an ON state.

In the differential amplifier according to the present invention, it may be so arranged, for example, that the first load circuit includes a first transistor (M1) and the second load circuit includes a second transistor (M2);

a drain of the first transistor (M1) is connected to the first node;

a gate of the first transistor (M1) is connected to the third node;

a drain of the second transistor (M2) is connected to the second and fifth nodes;

a gate of the second transistor (M2) is connected to the fourth node;

the gate of the first transistor (M1) and the drain of the first transistor (M1) are short-circuited, and a source of the first transistor (M1) is connected to a fixed potential;

the gate of the second transistor and the drain of the second transistor (M2) are connected or interrupted through the first switch (S1), and a source of the second transistor (M2) is connected to a fixed potential; and the first and second transistors (M1 and M2) constitute a current mirror load circuit.

In the present invention, it may be so configured that the first switch is constituted from a third transistor (M31), and a transistor (M32) with a drain thereof and a source thereof connected is provided between the third transistor (M31) and the fourth node (PC). Then, control signals of mutually opposite polarities are supplied to gates of the two transistors (M31 and M32).

In the differential amplifier according to the present invention, it may be so configured that the first load circuit includes first and fifth transistors (M1 and M11) and the second load circuit includes second and sixth transistors (M2 and M12);

a drain of the fifth transistor (M11) is connected to the first node;

a gate of the first transistor (M1) is connected to the third node;

a drain of the sixth transistor (M12) is connected to the second node;

a gate of the second transistor (M2) is connected to the fourth node;

a drain of the second transistor (M2) and a source of the sixth transistor (M12) are connected to the fifth node;

a gate of the first transistor (M1) and the drain of the fifth transistor (M11) are short-circuited;

a drain of the first transistor (M1) and a source of the fifth transistor (M11) are short-circuited;

the gate of the second transistor (M2) and the drain of the sixth transistor (M12) are connected or interrupted by the control signals; and the first, second, fifth, and sixth transistors (M1, M2, M11, M12) constitute a cascode-type current mirror load circuit.

The differential amplifier according to the present invention may include a second current source (transistor M59) and a sixth switch (S7) connected in parallel with the first current source 904 (transistor M9). It may be so configured that sixth switch (S7) is turned on in the first period (T01) and is turned off in the second period (T02).

In the present invention, it may be so configured that output switches are provided between the output terminal (VOUT) of the differential amplifier and an external load, and that the output switches are set in an OFF state during the first period (T01), and are set in an ON state during the second period.

A digital-to-analog conversion converter according to one aspect of the present invention includes:

the differential amplifier of the present invention;

resistances (301) connected in series between a higher first potential (VA) and a lower second potential (VB); and a selection circuit (302) for receiving voltages at taps of the resistances (301) and selecting voltages to be supplied to the first, second, and third signals, respectively, based on a selection signal.

A display device according to one aspect of the present invention is the display device including amplifier circuits each for receiving a gray scale voltage and driving a data line connected to a display element. The differential amplifier of the present invention is included as each of the amplifier circuits.

In the display device of the present invention, it may be so configured that the data line is constituted from a plurality of data lines and the data lines include first data lines and second data lines adjacent to the first data lines, respectively;

the differential amplifier is constituted from a plurality of differential amplifiers and the differential amplifiers include first differential amplifiers for charging and second differential amplifiers for discharging;

first output switches are respectively provided between each of the first differential amplifiers and each of the first data lines, and second output switches are respectively provided between each of the first differential amplifiers and each of the second data lines;

third output switches are respectively provided between each of the second differential amplifiers and each of the first data lines, and fourth output switches are respectively provided between each of the second differential amplifiers and each of the second data lines;

during a predetermined data output period, the second and third output switches are set in an OFF state and the first and fourth output switches are set in an ON state; and during a data output period subsequent to the predetermined data output period, the first and fourth output switches are set in an OFF state and the second and third output switches are set in an ON state.

The meritorious effects of the present invention are summarized as follows.

According to the present invention, outputting a voltage of high accuracy against fabrication variations in device characteristics is made possible using low power. There is a further effect that, by forming a differential amplifier capable of achieving multi-level output, the number of gray scale voltages to be supplied to decoders and the number of transistors constituting the decoders are reduced, thereby allowing area saving of a digital-to-analog converter.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 12 is a circuit configuration of a differential amplifier in a fourth embodiment of the present invention;

FIG. 18 is a diagram showing a configuration of an offset canceling amplifier described in a first embodiment of JP Patent Kokai Publication No. JP-P2001-292041A;

PREFERRED EMBODIMENTS OF THE INVENTION

The preferred embodiments of the present invention will be described below with reference to appended drawings. same reference symbols in respective drawings are assigned to same constituent elements.

<First Embodiment>

Figure 1:
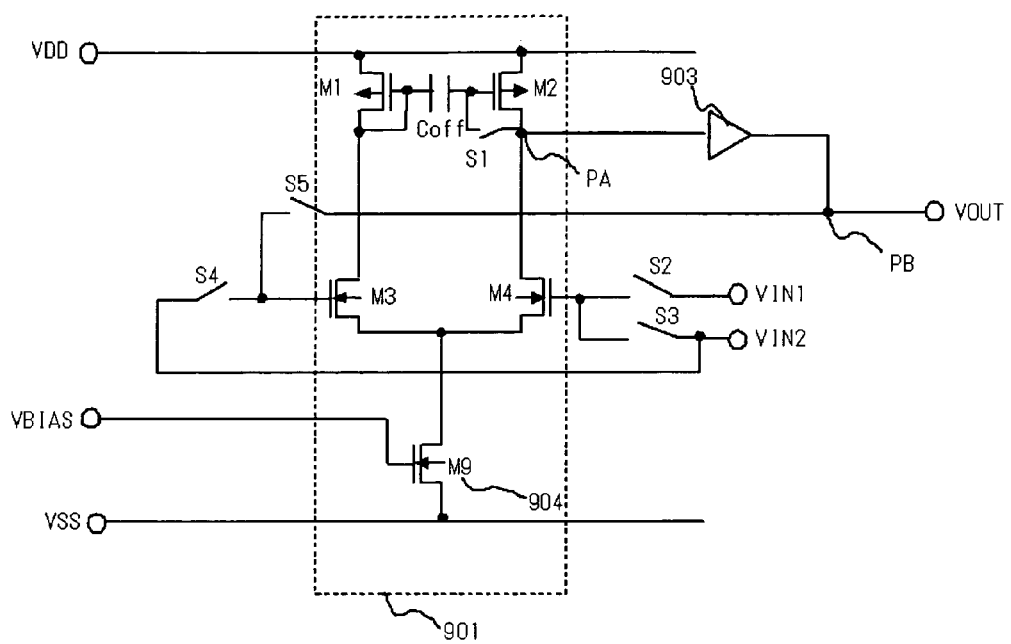
FIG. 1 is a diagram showing a circuit configuration of a differential amplifier as an amplifier for charging in a first embodiment of the present invention.

A circuit configuration according to a first embodiment of the present invention will be described below. FIG. 1 is a diagram showing a configuration of a differential amplifier according to the first embodiment of the present invention. Referring to FIG. 1, the differential amplifier according to the present embodiment includes a differential pair (constituted from transistors M3 and M4) which is driven by a current source 904 (a transistor M9 with a bias voltage supplied thereto), a load circuit to which the outputs of the differential pair is connected, and an output stage amplifier circuit 903 that receives a differential output signal. The load circuit is constituted from transistors M1 and M2. Drains of the transistors M1 and M2 are connected to drains of the transistors M3 and M4, respectively. A capacitance element (capacitor) Coff is connected between a gate of the transistor M1 and a gate of the transistor M2. The transistor M1 is diode-connected with the gate thereof and the drain thereof short-circuited. A switch S1 is provided between the gate of the transistor M2 and the drain of the transistor M2. By controlling the switch S1, whether to make the transistor M2 diode-connected or not is switched.

An input terminal VIN1 is connected to a gate of the transistor M4, which is one of the differential pair, through a switch S2, and an input terminal VIN2 is connected to the gate of the transistor M4 through a switch S3. The input terminal VIN2 is connected to a gate of the transistor M3, which is the other of the differential pair, through a switch S4, and an output terminal VOUT is connected to the gate of the transistor M3 through a switch S5.

Figure 2:
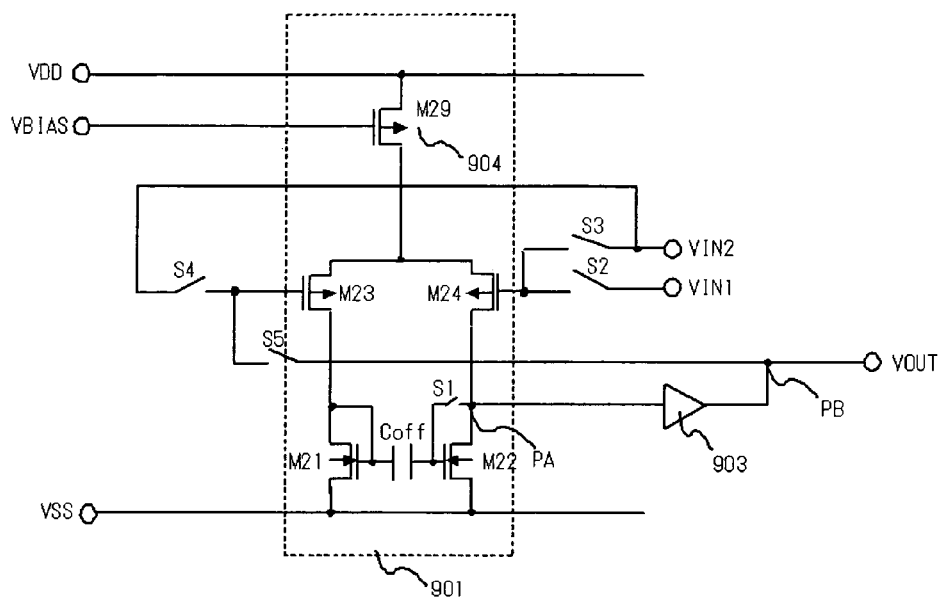
FIG. 2 is a diagram showing a circuit configuration of a differential amplifier as an amplifier for discharging in the first embodiment of the present invention.

In the differential amplifier in FIG. 1, the transistors M1 and M2 are constituted from PMOS transistors, the transistors M3, M4, and M9 are constituted from NMOS transistors, sources of the transistors M1 and M2 are connected in common to a common power supply terminal VDD, and a source of the transistor M9 is connected to a common ground terminal VSS. The differential amplifier in FIG. 1 thereby operates as the amplifier that charges an external load. The present invention is not limited to such an amplifier for charging, but is also effective as an amplifier for discharging having a configuration in which the NMOS transistors and the PMOS transistors are reversed, as shown in FIG. 2, for example.

Figure 3:
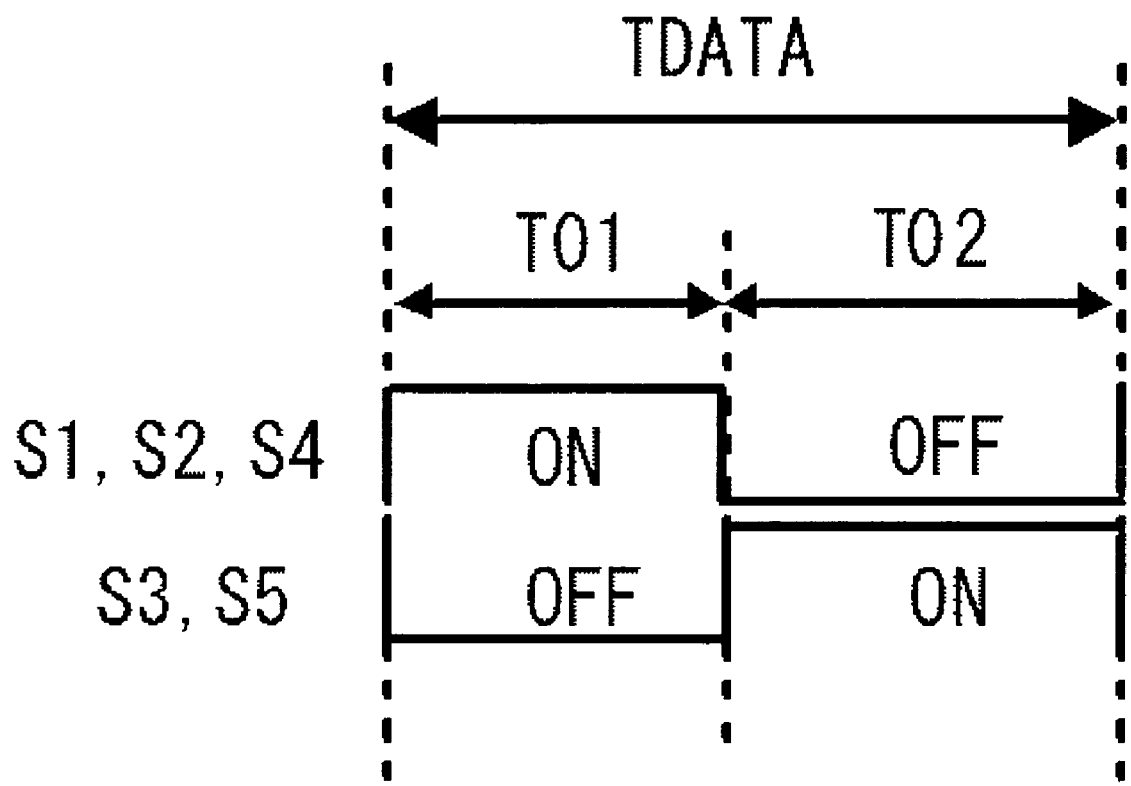
FIG. 3 is a timing chart diagram showing a control method of the differential amplifier in the first embodiment of the present invention.

FIG. 3 is a timing chart diagram of control signals for on/off controlling switches S1, S2, S3, S4, and S5 in the differential amplifier in FIG. 1 (or FIG. 2), respectively, in one data output period. The one data output period is divided into a period T01 and a period T02. The switches S1, S2 and S4 may be on/off controlled in common by a control signal and switches S3 and S5 may be on/off controlled in common by a complementary signal of the control signal for the switches S1, S2 and S4.

Next, operations of the differential amplifier according to the present embodiment shown in FIG. 1 will be described with reference to the timing chart diagram in FIG. 3. During the offset detection period T01, the switches S1, S2, and S4 are set in an ON state, and the switches S3 and S5 are set in an OFF state. In this case, the input terminal VIN1 (with a voltage Vin1) is connected to the transistor M4 of the differential pair, while the input terminal VIN2 (with a voltage Vin2) is connected to the transistor M3. Further, the switch S1 is turned on, thereby making both of the transistors M2 and M1 diode-connected with the drains thereof and the gates thereof short-circuited. When drain currents that flow through the transistors M1, M2, M3, and M4, respectively, during the period T01 are indicated by $I_1$, $I_2$, $I_3$, and $I_4$, respectively, the currents $I_1$, $I_2$, $I_3$, and $I_4$ are given by following equations (1) through (4):

$$I_1 = \frac{1}{2}\beta_p(V_{g1} - V_{thp1})^2 \qquad (1)$$

$$I_2 = \frac{1}{2}\beta_p(V_{g2} - V_{thp2})^2 \qquad (2)$$

$$I_3 = \frac{1}{2}\beta_n\{(V_{in2} - V_S) - V_{thn3}\}^2 \qquad (3)$$

$$I_4 = \frac{1}{2}\beta_n\{(V_{in1} - V_S) - V_{thn4}\}^2 \qquad (4)$$

where $V_{g1}$ indicates a gate-to-source voltage of the transistor M1, $V_{g2}$ indicates a gate-to-source voltage of the transistor M2, $V_s$ indicates a common source potential of the transistors M3 and M4 (a drain potential of the transistor M9), $\beta_p$ indicates a transconductance of a PMOS transistor, and $\beta_n$ indicates a transconductance of an NMOS transistor.

the transconductance β is given as follows:

$$\beta = \mu \cdot C_{OX} \cdot W/L$$

where μ is an effective mobility of the carriers in the channel, $C_{OX}$ is a capacitance of a gate oxide film, W is a gate width (the width of the channel), and L is a gate length (the length of the channel).

Further, $V_{thp1}$, $V_{thp2}$, $V_{thn3}$, and $V_{thn4}$ are threshold voltages of the transistors M1, M2, M3, and M4, respectively.

When a predetermined potential is set to the capacitor Coff and a circuit operation has been in a steady state, the following equations hold:

$$I_1 = I_3,$$

$$I_2 = I_4.$$

When the voltages $V_{g1}$ and $V_{g2}$ are derived from the above respective equations of currents, the following equations (5) and (6) are derived.

$$\text{From } I_1 = I_3, \qquad (5)$$

$$\frac{1}{2}\beta_p(V_{g1} - V_{thp1})^2 = \frac{1}{2}\beta_n\{(V_{in2} - V_S) - V_{thn3}\}^2$$

$$\therefore V_{g1} = -\sqrt{\frac{\beta_n}{\beta_p}}(V_{in2} - V_S - V_{thn3}) + V_{thp1}$$

-continued

From $I_2 = I_4$, (6)

$$\frac{1}{2}\beta_p(V_{g2} - V_{thp2})^2 = \frac{1}{2}\beta_n\{(V_{in1} - V_S) - V_{thn4}\}^2$$

$$\therefore V_{g2} = -\sqrt{\frac{\beta_n}{\beta_p}}(V_{in1} - V_S - V_{thn4}) + V_{thp2}$$

Accordingly, a voltage $V_{2-1}$ set to the capacitor Coff is given in the following equation (7):

$$V_{2-1} = \frac{Q_{2-1}}{C_{off}} \quad (7)$$

$$= V_{g2} - V_{g1}$$

$$= \left(\sqrt{\frac{\beta_n}{\beta_p}} - \sqrt{\frac{\beta_n}{\beta_p}}\right)V_S + \left(-\sqrt{\frac{\beta_n}{\beta_p}}V_{in1} + \sqrt{\frac{\beta_n}{\beta_p}}V_{in2}\right) -$$

$$\sqrt{\frac{\beta_n}{\beta_p}}(V_{thn3} - V_{thn4}) - (V_{thp1} - V_{thp2})$$

$$= -\sqrt{\frac{\beta_n}{\beta_p}}(V_{in1} - V_{in2}) - \sqrt{\frac{\beta_n}{\beta_p}}(V_{thn3} - V_{thn4}) -$$

$$(V_{thp1} - V_{thp2})$$

A first term of the above equation (7) is the term proportional to a difference voltage between the voltage $V_{in1}$ and the voltage $V_{in2}$. A second term and a third term represent deviations of the threshold values of the transistors within differential circuits, respectively.

Next, during the offset compensation output period T02, the switches S1, S2, and S4 are set in an OFF state, while the switches S3 and S5 are set in an ON state. In this case, the input terminal VIN2 (with the voltage Vin2) is connected to the transistor M4 of the differential pair, and the output terminal VOUT (with a voltage Vout) is connected to the transistor M3. Further, the switch S1 is turned off, thereby disconnecting the drain of the transistor M2 and the gate of the transistor M2. A potential difference immediately after completion of the period T01 is held at both ends of the capacitor Coff. When drain currents that flow through the transistors M1, M2, M3, and M4, respectively, during the period T02 are indicated by $I_{1b}$, $I_{2b}$, $I_{3b}$, and $I_{4b}$, respectively, the currents $I_{1b}$, $I_{2b}$, $I_{3b}$, and $I_{4b}$ are given by following equations (8) through (11):

$$I_{1b} = \frac{1}{2}\beta_p(V_{g1b} - V_{thp1})^2 \quad (8)$$

$$I_{2b} = \frac{1}{2}\beta_p(V_{g2b} - V_{thp2})^2 \quad (9)$$

$$I_{3b} = \frac{1}{2}\beta_n\{(V_{out} - V_S) - V_{thn3}\}^2 \quad (10)$$

$$I_{4b} = \frac{1}{2}\beta_n\{(V_{in2} - V_S) - V_{thn4}\}^2 \quad (11)$$

where $V_{g1b}$ and $V_{g2b}$ are gate-to-source voltages of the transistors M1 and M2 during the period T02, respectively.

By the way, an output voltage of the output terminal VOUT is supplied to the gate of the transistor M3. Thus, due to a feedback operation by the differential circuits (constituted from the transistors M1, M2, M3, and M4) and the potential held in the capacitor Coff, the output voltage VOUT reaches the predetermined potential and becomes stabilized.

In this case, the following equations hold:

$$I_{1b} = I_{3b},$$

$$I_{2b} = I_{4b}$$

Accordingly, when the voltages $V_{g1b}$ and $V_{g2b}$ are derived from the respective relational expressions, the following equations (12) and (13) are obtained:

From $I_{1b} = I_{3b}$, (12)

$$V_{g1b} = -\sqrt{\frac{\beta_n}{\beta_p}}(V_{out} - V_S - V_{thn3}) + V_{thp1}$$

From $I_{2b} = I_{4b}$, (13)

$$V_{g2b} = -\sqrt{\frac{\beta_n}{\beta_p}}(V_{in2} - V_S - V_{thn4}) + V_{thp2}$$

When a transition is made from the period T01 to the period T02, electric charges held in the capacitor Coff are stored. Accordingly, the following equation (14) holds, by which the output voltage Vout is given:

$$C_{off}(V_{g2} - V_{g1}) = C_{off}(V_{g2b} - V_{g1b}) \quad (14)$$

$$-\sqrt{\frac{\beta_n}{\beta_p}}(V_{in1} - V_{in2}) - \sqrt{\frac{\beta_n}{\beta_p}}(V_{thn3} - V_{thn4}) - (V_{thp1} - V_{thp2}) =$$

$$-\sqrt{\frac{\beta_n}{\beta_p}}(V_{in2} - V_{out}) - \sqrt{\frac{\beta_n}{\beta_p}}(V_{thn3} - V_{thn4}) - (V_{thp1} - V_{thp2})$$

$$(V_{in1} - V_{in2}) = (V_{in2} - V_{out})$$

$$\therefore V_{out} = V_{in2} + (V_{in2} - V_{in1})$$

Figure 4:
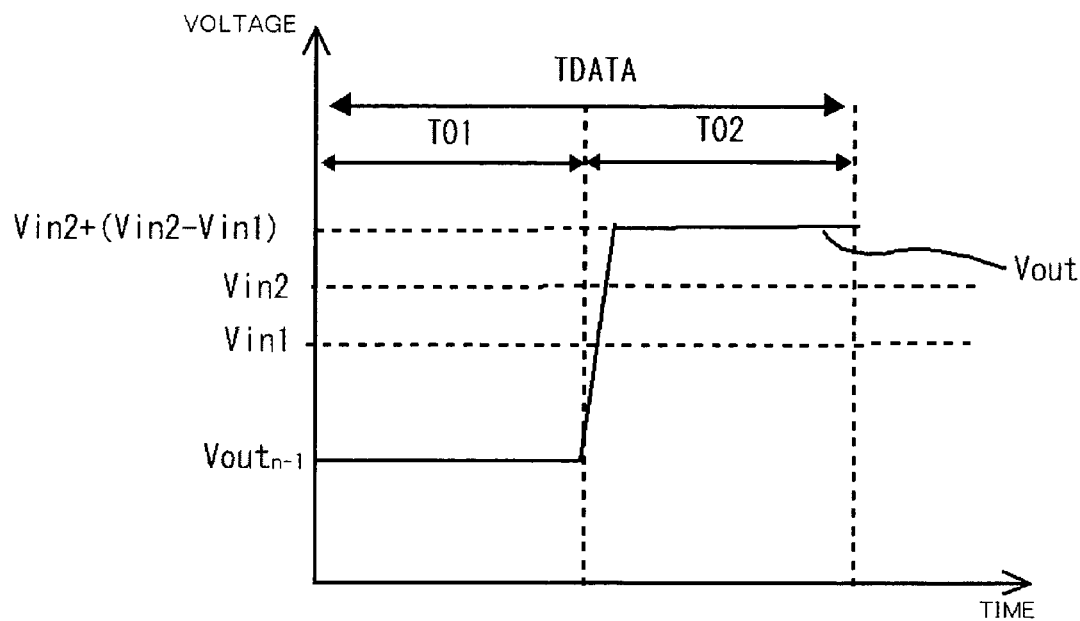
FIG. 4 is a graph explaining a temporal waveform of an output voltage of the differential amplifier in the first embodiment of the present invention.

Accordingly, a waveform of the output voltage becomes as shown in FIG. 4, by a series of control described above.

That is, in the period T01, a voltage in which an offset voltage (=Voff) and an extrapolated difference voltage (Vin2−Vin1) are superimposed is set to the capacitor Coff. In the period T02, a voltage obtained by externally dividing the voltage Vin2 and the voltage Vin1 at a ratio of 1 to 2 can be output as the output voltage Vout with high accuracy, based on the potential held in the capacitor Coff, by the feedback operation.

Figure 5A:
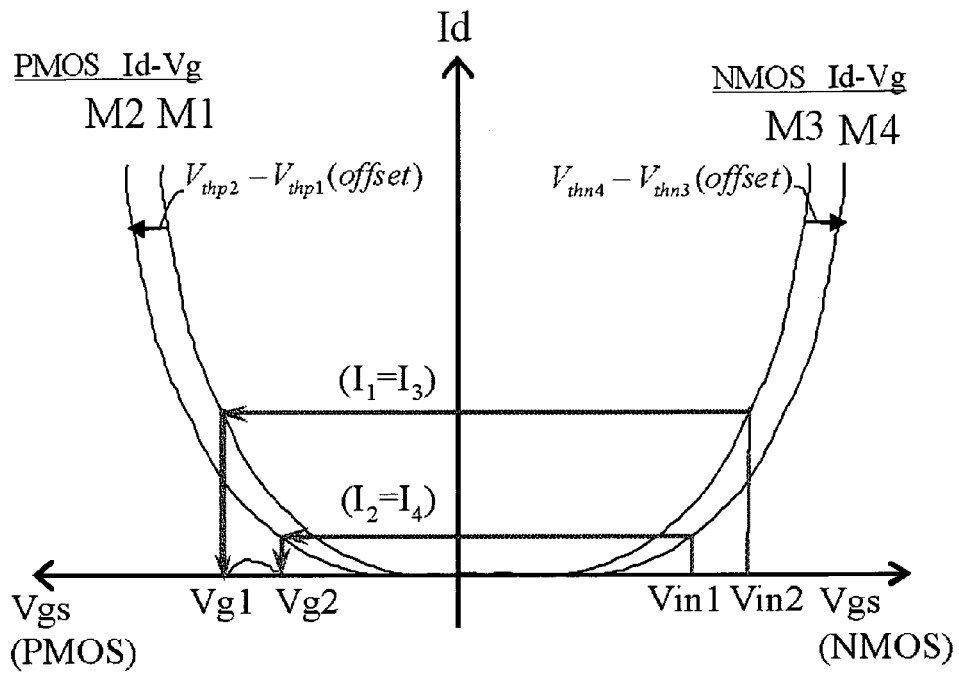
FIGS. 5A and 5B include graphs explaining effects of operations of the differential amplifier in the first embodiment of the present invention.
Figure 5B:
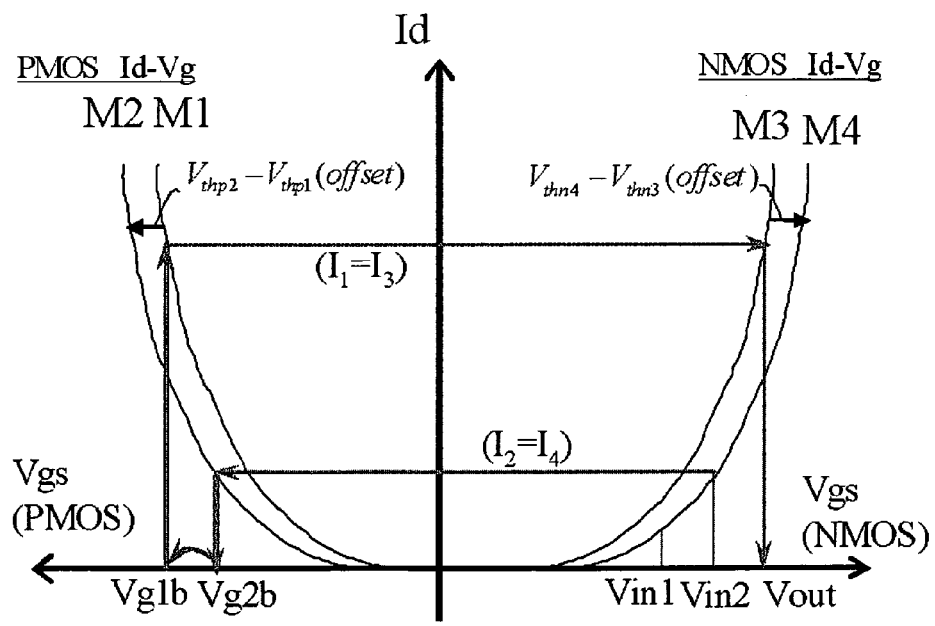

FIGS. 5A and 5B are diagrams for explaining actions of an offset detecting operation and an offset compensation output operation in the present embodiment, respectively. FIG. 5A shows a relationship between the gate-to-source voltage of each transistor and the drain current of each transistor in the period T01, while FIG. 5B shows a relationship between the gate-to-source voltage of each transistor and the drain current of each transistor in the period T02. It is preferable that characteristics of the transistors M3 and M4 are the same, and that characteristics of the transistors M1 and M2 are the same. However, in view of generation of the deviations of the threshold values caused by fabrication variations, characteristic curves of the transistors M1 and M2 and characteristic curves of the transistors M3 and M4 are shifted by predetermined amounts, respectively. Though drain current directions (polarity signs) differ between the PMOS transistors and the NMOS transistors, the drain current directions are aligned to be of the same polarity, for convenience.

When the voltage Vin1 is supplied to the NMOS transistor M4 and the voltage Vin2 is supplied to the NMOS transistor M3 in the period T01, gate effective voltages (voltages each obtained by subtracting the threshold voltage from the gate-to-source voltage) of the NMOS transistors M4 and M3 are transmitted to the gates of the PMOS transistors M2 and M1 at a transconductance ratio $\sqrt{\beta n}/\sqrt{\beta p}$ (so that $I_1=I_3$ and $I_2=I_4$ hold), respectively. Accordingly, the voltages $V_{g1}$ and $V_{g2}$ are determined, and the potential difference set at both ends of the capacitor Coff is given by the following equation (15):

$$V_{2-1} = \frac{Q_{2-1}}{C_{off}} \qquad (15)$$

$$= -\sqrt{\frac{\beta_n}{\beta_p}}(V_{in1}-V_{in2}) - \sqrt{\frac{\beta_n}{\beta_p}}(V_{thn3}-V_{thn4}) - (V_{thp1}-V_{thp2})$$

Next, the voltage Vin2 is applied to the transistor M4 in the period T02. In this case, if the voltage Vout has reached a steady state, $I_2=I_4$ holds. The gate effective voltage of the transistor M4 is transmitted to the transistor M2 at the transconductance ratio $\sqrt{\beta n}/\sqrt{\beta p}$, so that the voltage $V_{g2b}$ is determined. Since the predetermined potential is held in the capacitor Coff, the voltage $V_{g1b}$ is determined. When the voltage $V_{g1b}$ is determined, the gate effective voltage is transmitted to the transistor M3 at a transconductance ratio $\sqrt{\beta p}/\sqrt{\beta n}$, so that the output voltage Vout is determined. At this point, the output voltage Vout is represented by the following equation (16) (which is the same as the above equation (14)).

$$V_{out}=V_{in2}+(V_{in2}-V_{in1}) \qquad (16)$$

While the above description was directed to the operations and actions of the circuit in FIG. 1, the same effect can be of course obtained from the differential amplifier in FIG. 2 configured from transistors of the opposite polarities. A high-potential power supply is indicated by VDD, and a low-potential power supply is indicated by VSS. Fixed potentials with low impedances may be arbitrarily set as these power supplies.

As described above, the output voltage obtained by externally dividing the input voltages at the ratio of 1 to 2 can be output. Accordingly, by setting the voltages Vin1 and Vin2 to optimal voltages, various voltages can be output in the period T02. That is, multi-level output becomes possible in which the number of the output voltages is larger than the number of the input voltages.

Figures 6A, 6B:
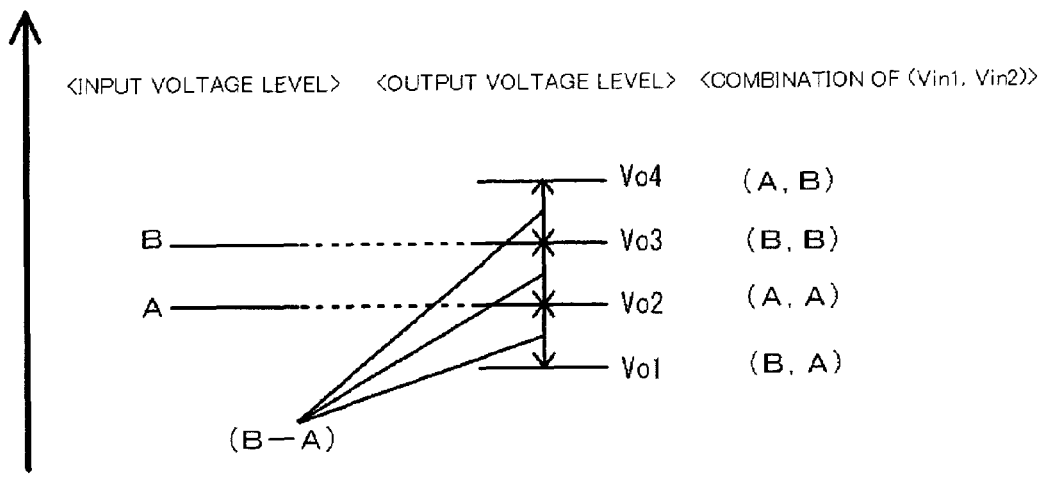
FIGS. 6A and 6B includes a diagram and a table for explaining multi-level output by the differential amplifier in the first embodiment of the present invention.

FIGS. 6A and 6B are diagrams for explaining an embodiment of the multi-level output by the differential amplifier in FIG. 1. FIG. 6A shows relationships between input and output levels, and FIG. 6B shows relationships of voltage selection states associated with two-bit digital data (D1, D0). A description will be given about a case where the input voltage has A and B levels, as shown in FIG. 6A. By selecting each of the input voltages Vin1 and Vin2 as voltages A and B, respectively, four levels of Vo1 to Vo4 can be output as the output voltages.

When the voltage Vo1 is output, and when the voltages B and A are selected as the input voltages Vin1 and Vin2, respectively, the following equation holds using the above equation (16).

$$Vo1=\{A+(A-B)\}=\{A-(B-A)\}$$

That is, the voltage Vo1 becomes the voltage that has been level shifted from the voltage A to a lower potential side by a potential difference (B−A).

When the voltage Vo2 is output, and when the voltage A is selected for the input voltages Vin1 and Vin2, Vo2={A+(A−A)}=A holds, using the above equation (16). That is, the voltage Vo2 becomes the voltage A.

When the voltage Vo3 is output, and when the voltage B is selected for the input voltages Vin1 and Vin2, Vo3={B+(B−B)}=B holds, using the above equation (16). That is, the voltage Vo3 becomes the voltage B.

When the voltage Vo4 is output, and when the voltages A and B are selected as the input voltages Vin1 and Vin2, respectively, Vo4={B+(B−A)} holds, using the above equation (16). That is, the voltage Vo4 becomes the voltage that has been level shifted from the voltage B to a higher potential side by the potential difference (B−A).

As described above, when selection is made as shown in FIG. 6(a), four levels of the voltages can be output with respect to the two input voltages. In this case, a spacing between the adjacent levels can be set to the predetermined potential difference (B−A).

Further, as shown in FIG. 6B, the four voltages Vo1 to Vo4 can be selectively output using the two-bit digital data (D1, D0).

That is, the levels Vo1 to Vo4 are output, corresponding to the two-bit digital data (D1, D0) of (0, 0), (0, 1), (1, 0), and (1, 1), respectively.

Figure 7:
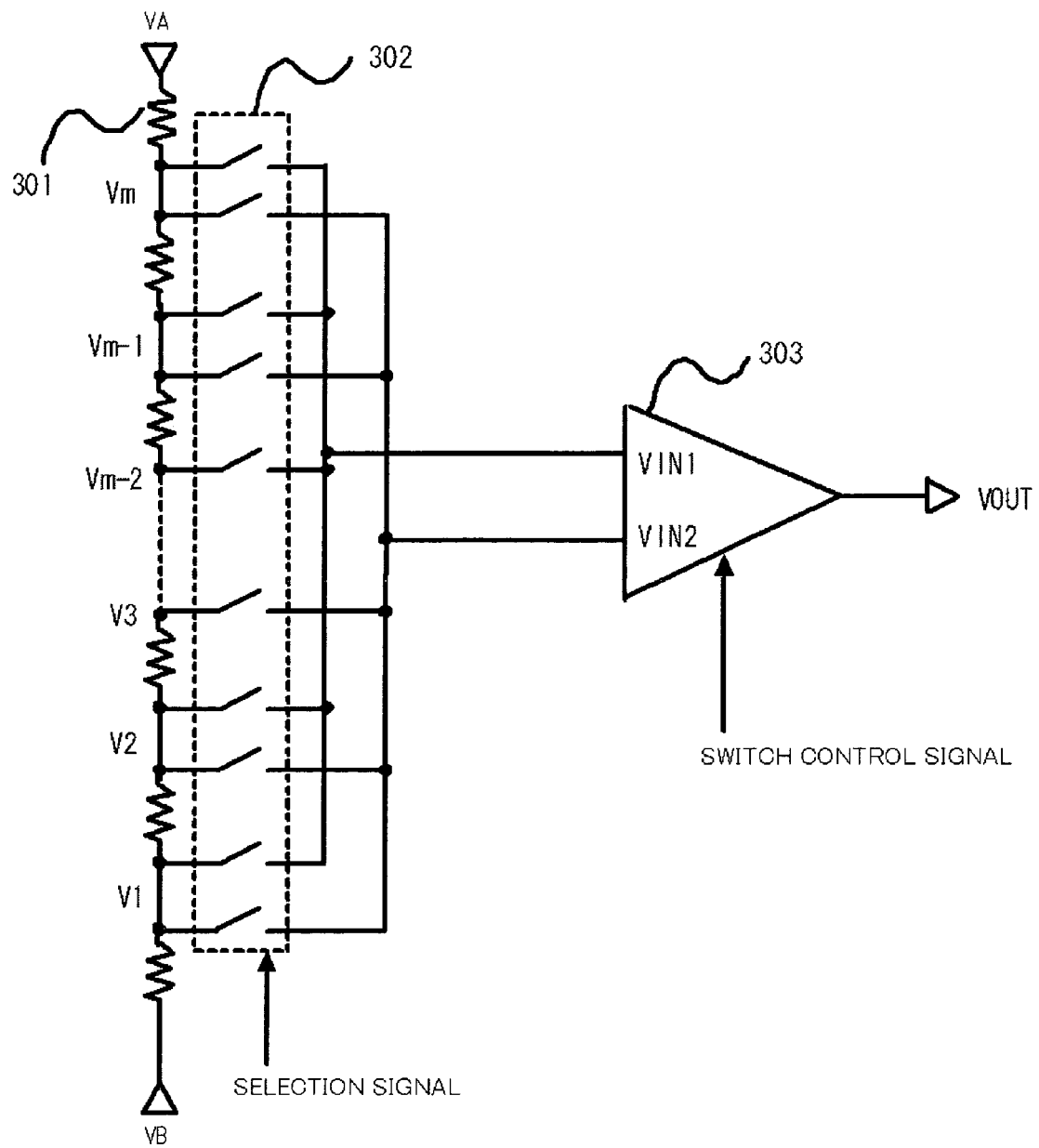
FIG. 7 is a diagram showing a configuration of a digital-to-analog converter having the differential amplifier of the present invention.

FIG. 7 is a diagram showing a configuration of a digital-to-analog converter that uses the differential amplifier of the present invention. Referring to FIG. 7, the differential amplifier in the embodiment of the present invention shown in FIGS. 1 and 2 is employed as a circuit block 303 (multi-level output type differential amplifier).

At connection terminals of a plurality of resistance elements (resistor array) 301 connected in series between power supply voltages VA and VB, m voltages of V1 to Vm to be selectively applied to the circuit block 303 are generated. The voltages are selected by switches 302, respectively, and are input to the two input terminals VIN1 and VIN2.

A switch control signal is supplied to the circuit block 303 to perform control over the switches S1 to S5 shown in FIGS. 1 and 2.

A selection signal is supplied to the switches 302, so that a voltage level or voltage levels in accordance with the selection signal is or are output to the input terminals VIN1 and VIN2. As the selection signal, a digital signal indicative of video data or the like can be used.

As explained using FIGS. 6A and 6B, the circuit block 303 can output four voltage levels with respect to at least two different input voltages, according to a selection criteria.

Figure 22:
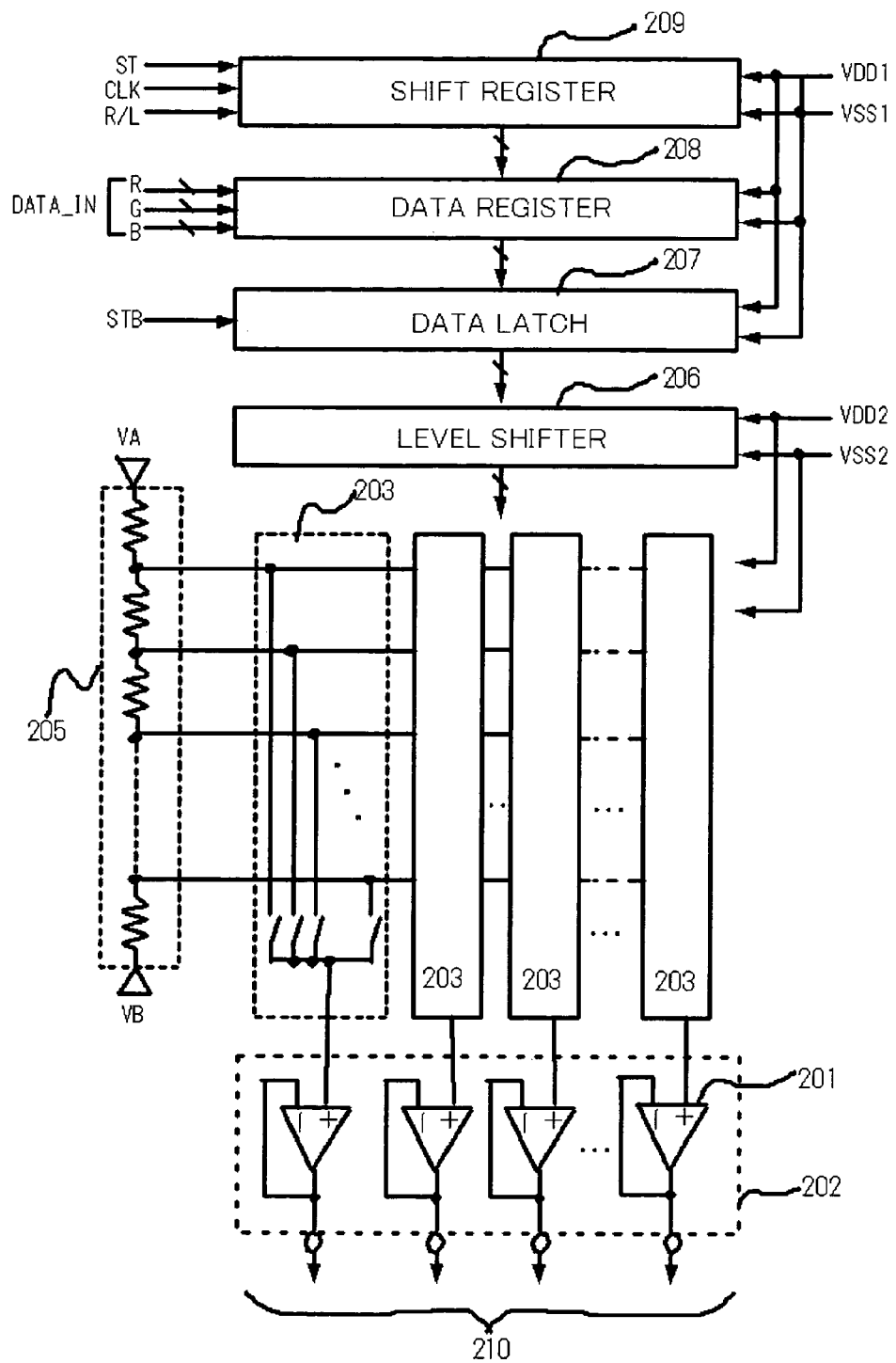
FIG. 22 is a diagram showing a schematic configuration of a conventional data driver in a liquid crystal display device.

Accordingly, by variously selecting the m voltages of V1 to Vm as inputs to the input terminals VIN1 and VIN2, a lot of voltage levels of m or larger can be further output. In the configuration of the digital-to-analog converter in FIG. 7, a lot of output voltages can be obtained with the small number of input voltages. Thus, the number of the switches for selecting input voltages can be reduced, so that the circuit size can be reduced more than a conventional circuit with the same number of output levels (a digital-to-analog conversion circuit block portion in FIG. 22).

<Second Embodiment>

Figure 8:
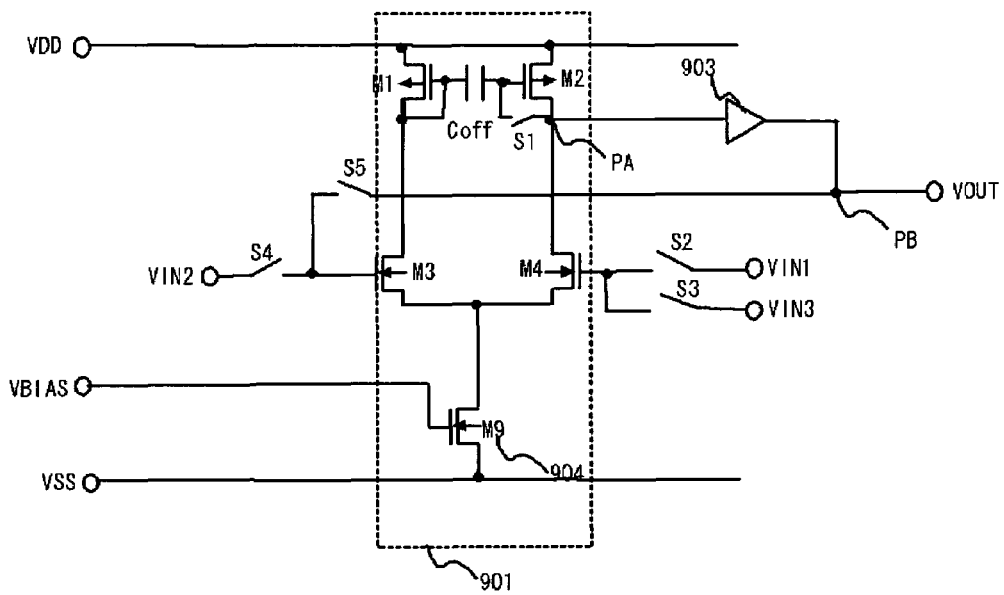
FIG. 8 is a diagram showing a circuit configuration of a differential amplifier as an amplifier for charging in a second embodiment of the present invention.

Next, a second embodiment of the present invention will be described. FIG. 8 is a diagram showing a configuration of a differential amplifier according to the second embodiment of the present invention. Referring to FIG. 8, the differential amplifier according to the present embodiment includes a differential pair (constituted from transistors M3 and M4) to be driven by a current source 904 (a transistor M9 with a bias voltage supplied thereto), a load circuit to which the differential pair is connected, and an output stage amplifier circuit 903 that receives a differential output signal. The load circuit described above is constituted from transistors M1 and M2. Drains of the transistors M1 and M2 are connected to drains of the transistors M3 and M4, respectively. A capacitance element Coff is connected between gates of the transistors M1 and M2. The transistor M1 is diode-connected. A switch S1 is provided between the gate and the drain of the transistor M2. By performing on/off control over the switch S1, whether to make the transistor M2 diode-connected or not is switched.

An input terminal VIN1 is connected to a gate of the transistor M4, which is one of the differential pair, through a switch S2, and an input terminal VIN3 is connected to the gate of the transistor M4 through a switch S3. An input terminal VIN2 is connected to a gate of the transistor M3, which is the other of the differential pair, through a switch S4, and an output terminal VOUT is connected to the gate of the transistor M3 through a switch S5.

In the differential amplifier shown in FIG. 8, the transistors M1 and M2 are constituted from PMOS transistors, the transistors M3, M4, and M9 are constituted from NMOS transistors, sources of the transistors M1 and M2 are connected to a common power supply terminal VDD with low impedance, and a source of the transistor M9 is connected to a common ground terminal VSS. The differential amplifier in FIG. 8 thereby operates as the amplifier that charges an external load. The present invention is not limited to the amplifier for charging, but is also effective as the amplifier for discharging having a configuration in which the NMOS transistors and the PMOS transistors are reversed.

Figure 9:
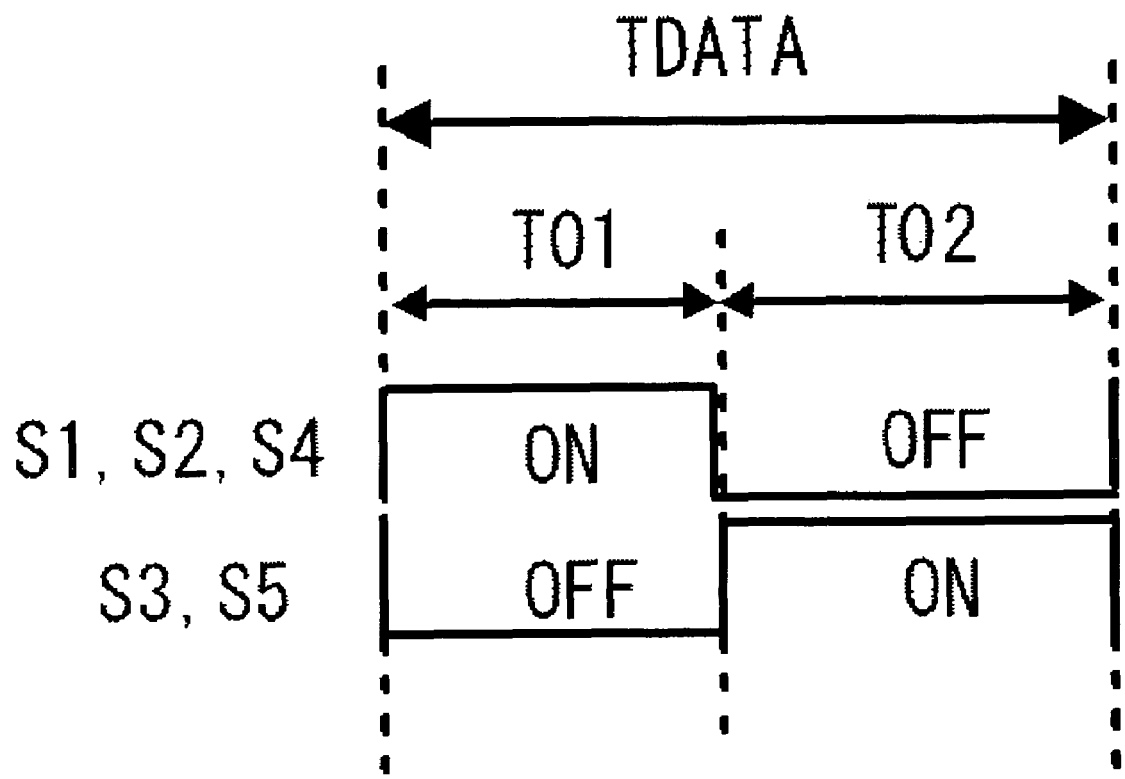
FIG. 9 is a timing chart diagram showing a control method of the differential amplifier in the second embodiment of the present invention.

FIG. 9 is a timing chart diagram of control signals for on/off controlling the switches S1, S2, S3, S4, and S5 in the differential amplifier in FIG. 8, respectively, in one data output period. The one data output period is divided into the period T01 and the period T02.

Next, an operation of the differential amplifier according to the present embodiment shown in FIG. 8 will be described with reference to the timing chart diagram in FIG. 9. During the offset detection period T01, the switches S1, S2, and S4 are set in an ON state, and the switches S3 and S5 are set in an OFF state. In this case, the input terminal VIN1 (with a voltage Vin1) is connected to the transistor M4 of the differential pair, while the input terminal VIN2 (with a voltage Vin2) is connected to the transistor M3. Further, the switch S1 is turned on, thereby making both of the transistors M2 and M1 diode-connected. A voltage set to the capacitor Coff at this time is derived as in the first embodiment described before, and is given by the following equation (17):

$$V_{2-1} = \frac{Q_{2-1}}{C_{off}} \qquad (17)$$

$$= -\sqrt{\frac{\beta_n}{\beta_p}}(V_{in1} - V_{in2}) - \sqrt{\frac{\beta_n}{\beta_p}}(V_{thn3} - V_{thn4}) - (V_{thp1} - V_{thp2})$$

Next, during the offset compensation output period T02, the switches S1, S2, and S4 are turned off, while the switches S3 and S5 are set in an ON state. In this case, the input terminal VIN3 (with a voltage Vin3) is connected to the transistor M4 of the differential pair, and the output terminal VOUT (with the voltage Vout) is connected to the transistor M3. Further, the switch S1 is turned off, thereby disconnecting the drain of the transistor 2 and the gate of the transistor M2. A potential difference immediately after completion of the period T01 is held in the capacitor Coff. An output voltage Vout at this time can be computed as in the first embodiment and is given by the following equation (18):

$$V_{out} = V_{in3} + (V_{in2} - V_{in1}) \qquad (18)$$

Figure 10:
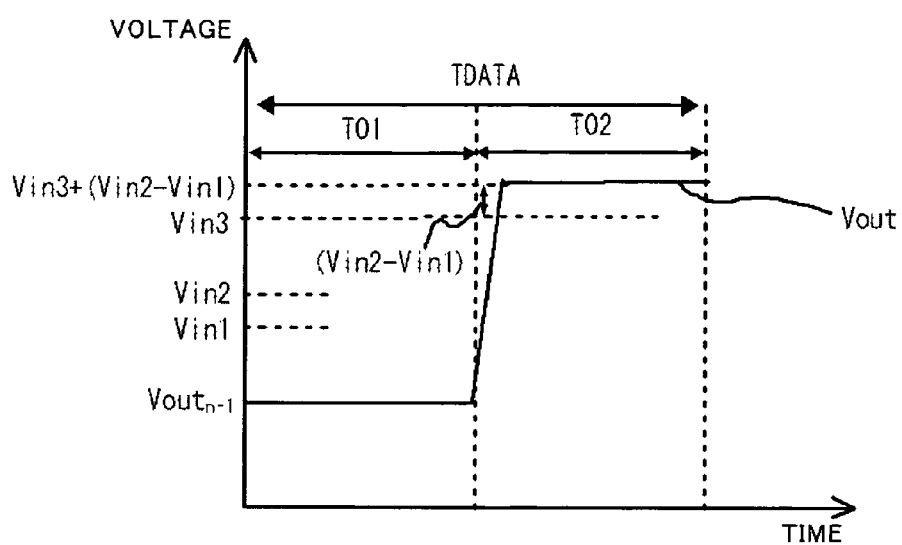
FIG. 10 is a graph explaining a temporal waveform of an output voltage of the differential amplifier in the second embodiment of the present invention.

Accordingly, a waveform of the output voltage becomes as shown in FIG. 10, by a series of control described above. That is, in the period T01, a voltage in which the offset voltage (=Voff) and an input difference voltage (Vin2−Vin1) are superimposed is set to the capacitor Coff. In the period T02, a voltage level shifted from the potential Vin 3 just by a potential difference (Vin2−Vin1) by feedback control based on the potential held in the capacitor Coff can be output as the output voltage Vout with high accuracy.

An embodiment of multi-level output by the differential amplifier in FIG. 8 is the same as in FIG. 6 when the voltage Vin3 is set to be equal to the voltage Vin2. Further, when the voltage Vin3 is set to be equal to the voltage Vin2, an embodiment of a digital-to-analog converter is the same as that in FIG. 7.

Accordingly, as in the first embodiment, in the digital-to-analog converter that uses the differential amplifier in FIG. 8, a lot of output voltages can be obtained with a small number of input voltages. Thus, the number of the switches for selecting the input voltages can be reduced, so that the circuit size can be reduced more than the conventional circuit with the same number of output levels.

<Third Embodiment>

Figure 11:
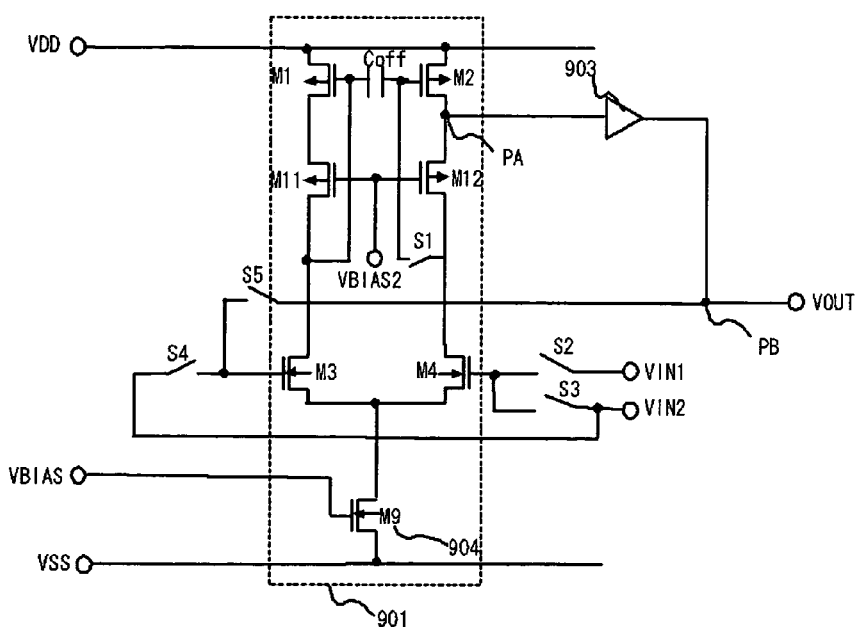
FIG. 11 is a diagram showing a circuit configuration of a differential amplifier in a third embodiment of the present invention.

Next, a third embodiment of the present invention will be described. FIG. 11 is a diagram showing a configuration of a differential amplifier in the third embodiment of the present invention. Only a difference between FIG. 11 and FIG. 1 (showing the configuration of the first embodiment) will be described. In FIG. 11, transistors M11 and M12 are added, and a predetermined potential is applied to each of gates of the transistors M11 and M12 by a VBIAS2. A drain of the transistor M11 is connected to the drain of the transistor M3, the gate of the transistor M1, and one end of the capacitor Coff. A source of the transistor M11 is connected to the drain of the transistor M1. A drain of the transistor M12 is connected to the drain of the transistor M4, the gate of the transistor M2, and the other end of the capacitor Coff through the switch S1. A source of the transistor M12 is connected to the drain of the transistor M2. When the switch S1 is turned off, the four transistors M1, M2, M11, and M12 form a cascode type current mirror circuit.

In the case of the simplest current mirror circuit formed by the transistors M1 and M2 alone, the drain currents of the transistors M1 and M2 change depending on drain voltages thereof due to a channel-length modulation effect (in which the wider a potential difference between the gate and the drain of each of the transistors becomes, an actual channel length formed by an inversion layer thereof is shortened), thereby generating an error in an output current of the current mirror circuit. Then, when the cascode-type current mirror circuit described above is constructed, the error in the current caused by the channel length modulation effect can be reduced. Computation of the current can be therefore performed with high accuracy. These discussions are described in Non-patent Document 1, for example.

Control over the switches in the present embodiment shown in FIG. 11 is set to be the same as that in the first embodiment, and is the same as that shown in the timing chart diagram in FIG. 3.

In addition to the cascode current mirror circuit in FIG. 11, there is also a circuit that forms a cascode by connecting transistors in cascode or folded manner. In other cascode current mirror as well, multi-level output is possible, based on the same principle. When the cascode in FIG. 11 is used, there is an advantage that a limit to an output voltage range determined by the transistors M2 and M12 connected in cascode can be minimized.

Accordingly, by using the configuration as shown in FIG. 11, the multi-level output with higher accuracy against the fabrication variations in device characteristics becomes possible. Reduction in the area of a digital-to-analog converter can be therefore achieved.

<Fourth Embodiment>

Next, a fourth embodiment of the present invention will be described. FIG. 12 is a diagram showing a configuration of a differential amplifier according to the fourth embodiment of the present invention. A difference between FIG. 12 and FIG. 1 (showing the configuration of the first embodiment) will be described below (with description of same portions omitted as necessary). In the present embodiment, a switch S6 with an input terminal thereof and an output terminal thereof short-circuited is added between the switch S1 and a node PC. By a switch circuit 910 formed of the switches S1 and S6, switching noise, which will be produced when the switch S1 is turned off, can be reduced. Control signal timings for the switches S1 and S6 must be set in an antiphase relationship (relationship in which when one of the switches is on, the other is off). The control signal timings for the switch S1 and control timings for the switches S2 to S5 are the same as those in the timing chart in FIG. 3.

Noise produced at a time of switching off is caused by capacitive coupling in a switch and channel charges of the switch. When electric charges have flown from the switch S1 to the capacitor Coff, the potential held in the capacitor Coff does not become accurate, so that an output offset is caused.

Figure 13A:
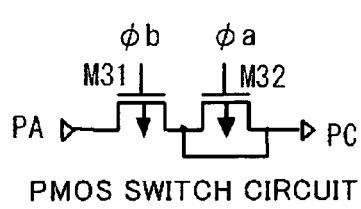
FIGS. 13A, 13B and 13C include diagrams showing examples of a switch circuit in the fourth embodiment of the present invention.
Figure 13B:
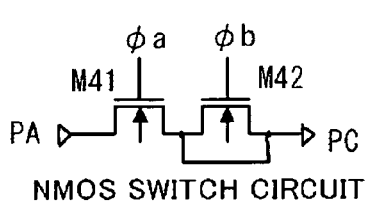
Figure 13C:
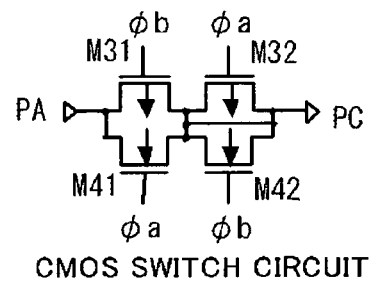

In order to describe the switch circuit 910 in detail, configuration examples of switches each constituted from a transistor are shown in FIGS. 13A through 13C. FIG. 13A shows a switch circuit constituted from PMOS transistors alone. FIG. 13B shows a switch circuit constituted from NMOS transistors alone. FIG. 13C shows a switch circuit constituted from the PMOS transistors and the NMOS transistors. A transistor M31 (or a transistor M41) corresponds to the switch S1, and a transistor M32 (or a transistor M42) corresponds to the switch S6.

Herein, the differential amplifier in FIG. 12 is the amplifier for charging, and a node PA and the node PC in the vicinity of the switch S1 are located in the vicinity of the power supply VDD. Accordingly, it is preferable that a PMOS switch (in FIG. 13A) or a CMOS switch (in FIG. 13C) is employed. In the case of the configuration in FIG. 12 and an amplifier for discharging having a configuration in which PMOS/NMOS is reversed, by using an NMOS switch (in FIG. 13B) or the CMOS switch (FIG. 13C), the same effect as that in the present embodiment can be obtained.

Next, an operation of this switch circuit 910 will be described. A following description will be given, assuming that the PMOS switch circuit shown in FIG. 13A is employed as the switch circuit in FIG. 12.

In the offset detection period T01, the switch S1 is turned on, the switch S6 is turned off, and the predetermined potential is set to the capacitor Coff. When a description is given using symbols shown in FIGS. 13A-13C, a switch controlling clock φa goes HIGH, a switch controlling clock φb goes LOW, and a drain and a source of the transistor M31 are brought into conduction.

Next, in the offset compensation output period T02, at the same time when the switch S1 is turned off, the switch S6 is turned on. When a description is given using the symbols shown in FIG. 13, the switch controlling clock φa goes LOW, the switch controlling clock φb goes HIGH, and the drain and the source of the transistor M31 are brought into a non-conduction state. When the transistor M31 transitions from a conduction state to a non-conduction state, the channel charges of the transistor M31 are distributed to the drain and the source of the transistor M31, and the clock of the switch control clock φb propagates through transistor capacitive coupling. The switching noise is thereby generated. However, electric charges are generated from the transistor M32 to which the inverted clock φa is input so as to compensate for generation of the charges caused by the switching noise. Accordingly, the switching noise is suppressed.

Generally, by setting a gate width of the transistor M32 to be a half of a gate width of the transistor M31, the noise can be accurately compensated for.

Even when the configuration shown in FIGS. 13B or FIG. 13C is adopted, the switching noise can be suppressed and the voltage can be accurately held in the capacitive element Coff, based on the same principle described above.

Accordingly, by using the configuration as in FIG. 12, multi-level output with higher accuracy against the fabrication variations in device characteristics and the switching noise becomes possible. Saving in the area of a digital-to-analog converter can be thereby achieved.

<Fifth Embodiment>

Figure 14:
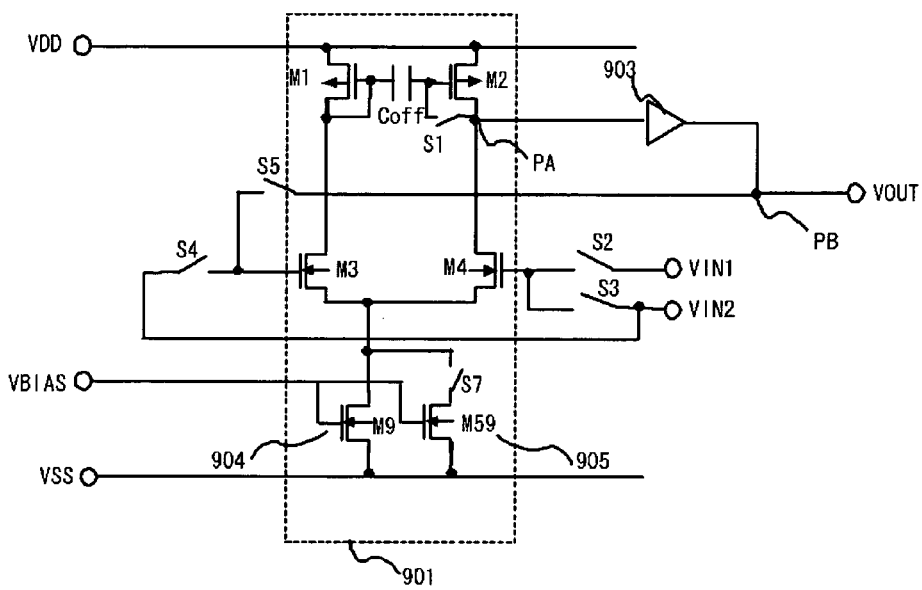
FIG. 14 is a diagram showing a circuit configuration of a differential amplifier in a fifth embodiment of the present invention.
Figure 15:
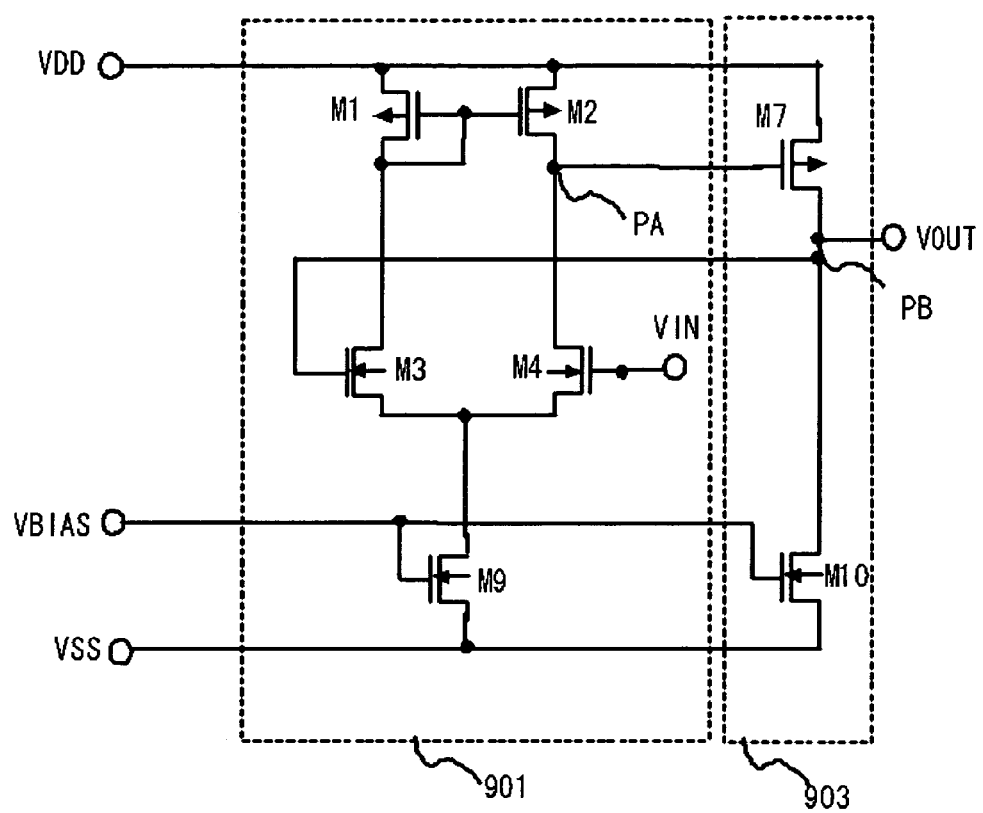
FIG. 15 is a diagram showing a configuration of an op-amp that has been conventionally used.
Figure 16:
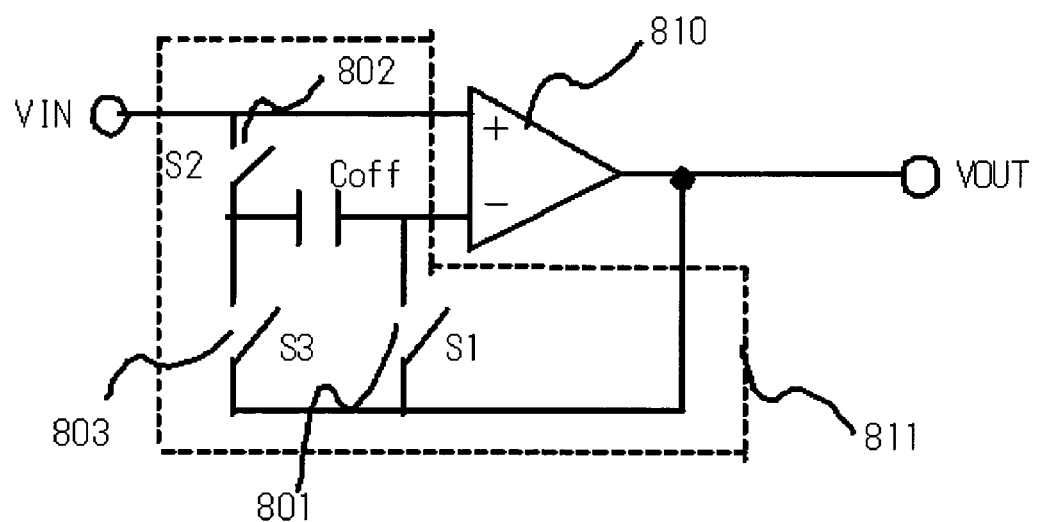
FIG. 16 is a diagram showing a configuration of an offset canceling amplifier that has been conventionally used.
Figure 17:
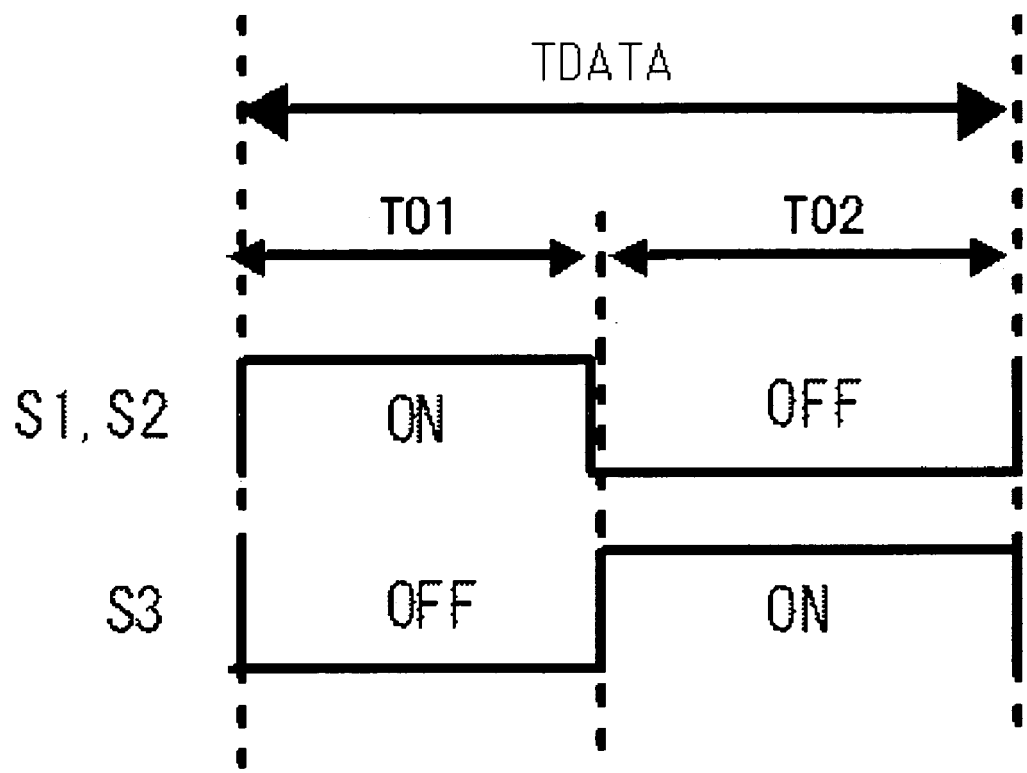
FIG. 17 is a timing chart diagram showing a control method of the offset canceling amplifier shown in FIG. 16.
Figure 19:
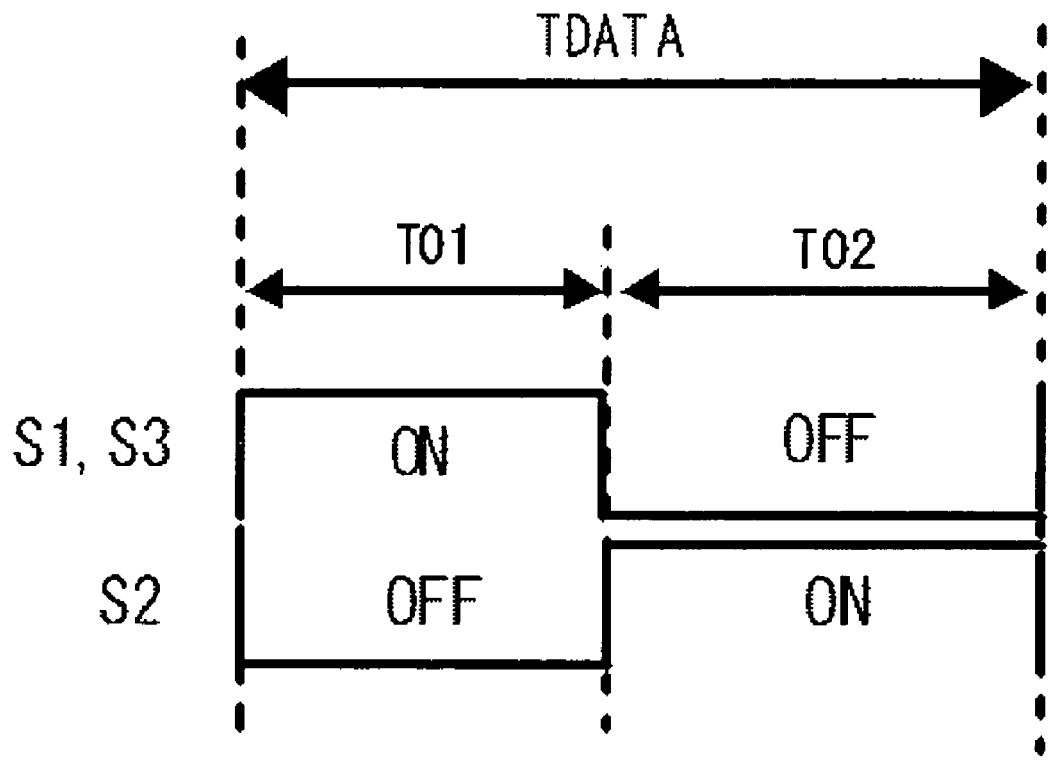
FIG. 19 is a timing chart diagram showing a control method over the offset canceling amplifier shown in FIG. 18.
Figure 20:
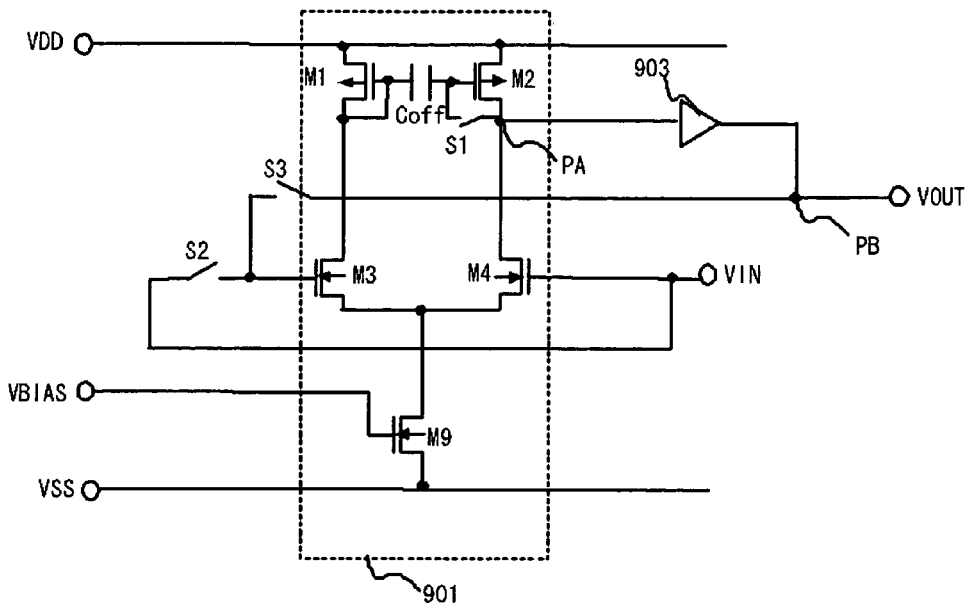
FIG. 20 is a diagram showing a configuration of an offset canceling amplifier described in JP Patent Kokai Publication No. JP-P2002-202748A.
Figure 21:
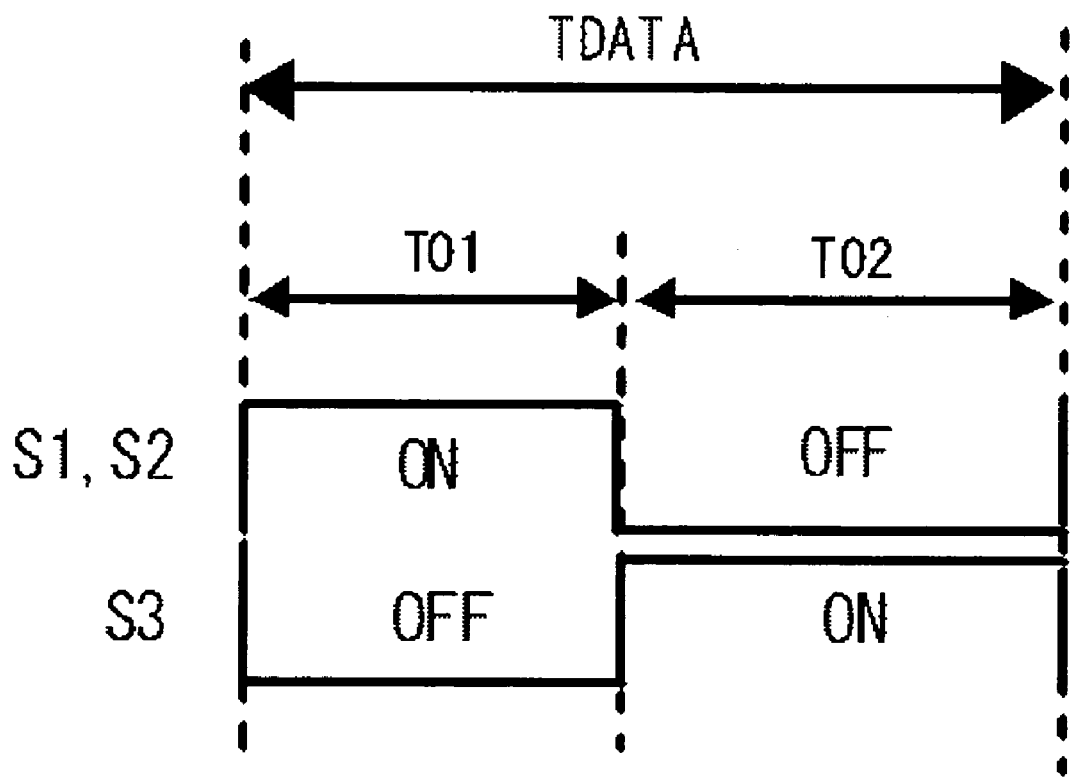
FIG. 21 is a timing chart diagram showing a control method over the offset canceling amplifier shown in FIG. 20.

A fifth embodiment of the present invention will be described. FIG. 14 is a diagram showing a configuration of a differential amplifier according to the fifth embodiment of the present invention. Only a difference between FIG. 14 and FIG. 1 (showing the configuration of the first embodiment) will be described. In the present embodiment, a transistor M59 is added between the ground terminal VSS and the common source terminal of the transistors M3 and M4 of the differential pair through a switch S7. Control signal timings for the switches S1 to S5 are the same as those in the timing chart in FIG. 3. The control signal timings for the switch S1 and control signal timings for the switch S7 are in an in-phase relationship (in which switching on and off of the switches are performed at the same times, respectively).

In the offset detection period T01, the predetermined potential is set to the capacitor Coff. On this occasion, one factor for determining a time required for charging (or discharging) is the current source 904 (transistor M9). Since the offset detection period is the period that does not substantially contribute to driving an external load, it is preferable that this period is shortened.

Since currents that flow through the differential circuits (constituted from the transistors M1, M2, M3, and M4) are determined by the current source 904, a magnitude of a current of this current source determines a time required for setting the predetermined voltage in the capacitor Coff.

By turning on the switch S7 to connect an auxiliary current source 905 in parallel with the current source 904, an amount of the current for driving the differential circuits is increased, and the desired potential is instantaneously set to the capacitor Coff.

In the period T02, the switch S7 is turned off, and the differential circuits are driven by the current source 903 alone.

Accordingly, by using the configuration as shown in FIG. 14, multi-level output with high accuracy against the fabrication variations in device characteristics becomes possible.

Saving in the area of a digital-to-analog converter can be thereby achieved. Further, the offset detection period can be shortened by actions of the current source 905 and the switch S7.

<Sixth Embodiment>

Figure 23:
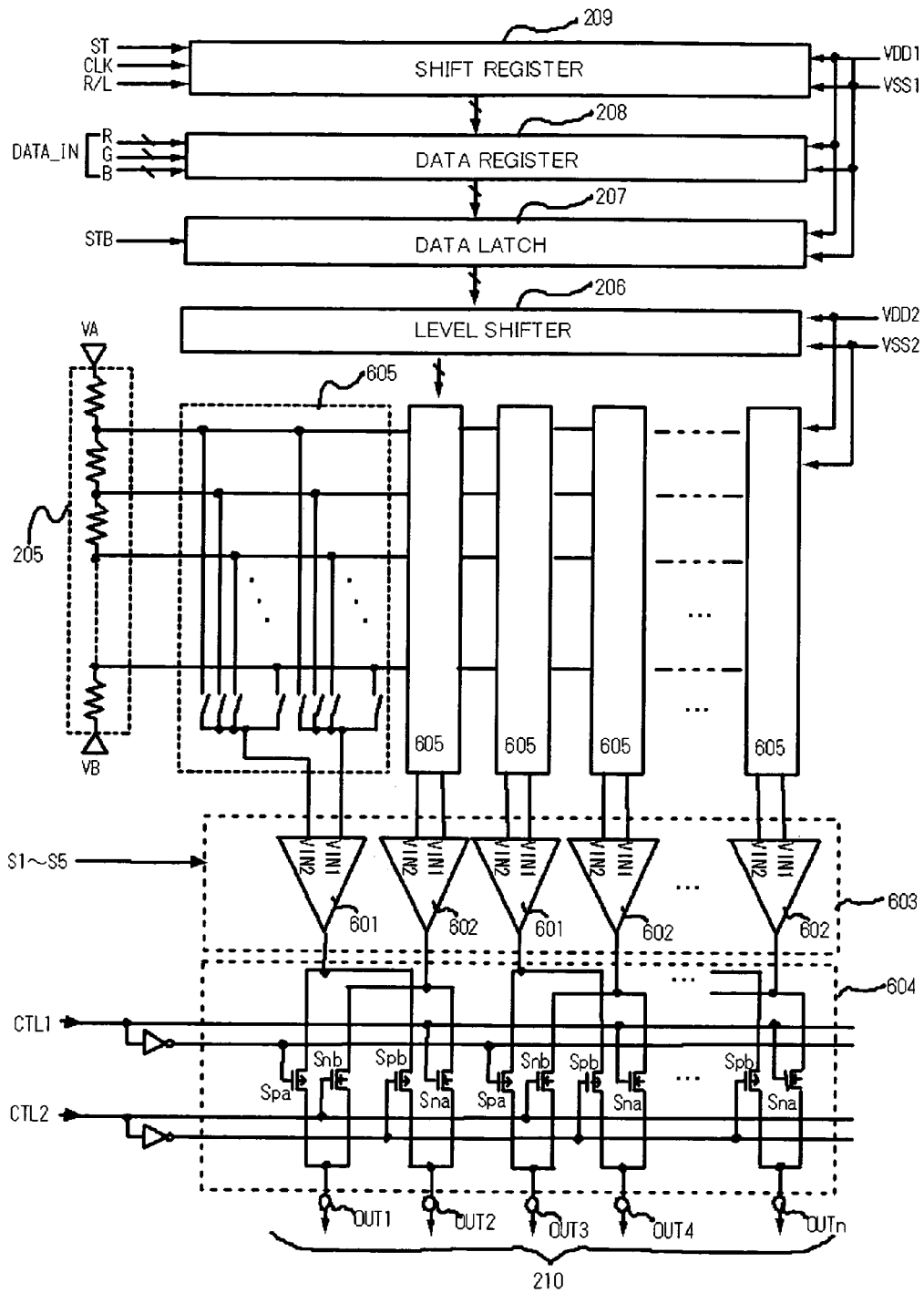
FIG. 23 is a diagram showing a configuration of a data driver in a display device in a sixth embodiment of the present invention.
Figure 24:
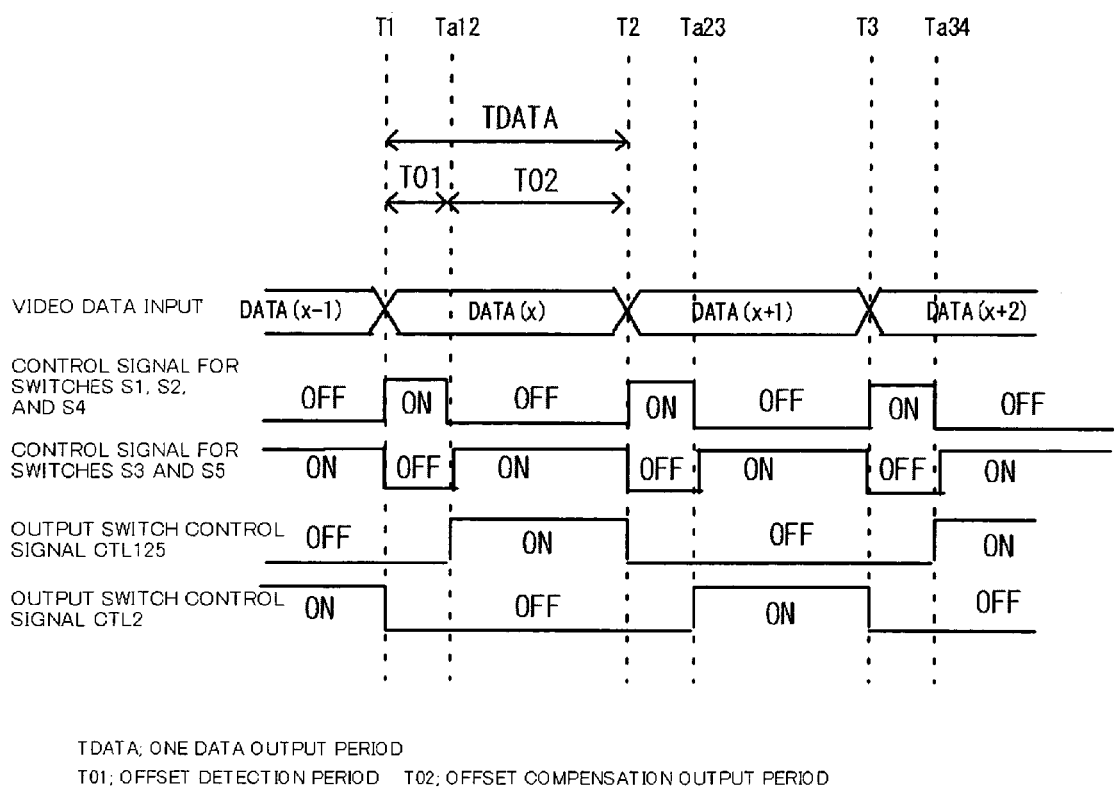
FIG. 24 is a diagram showing a control timing chart of the data driver in the display device in the sixth embodiment of the present invention.

A sixth embodiment of the present invention will be described. FIG. 23 is a diagram showing a configuration of a data driver in a display device in the sixth embodiment of the present invention. FIG. 24 is a diagram showing a control timing chart in FIG. 23.

Differences of the data driver in the display device in the present embodiment shown in FIG. 23 from a data driver of a conventional display device (in FIG. 22) are as follows:

the data driver of the display device according to the present embodiment includes:

multi-level output type differential amplifiers described in the first embodiment of the present invention as an output circuit (603), and decoders 605 associated with the multi-level output type differential amplifiers, for outputting two analog values to the output circuit.

The data driver further includes an output switch circuit 604 connected between the output circuit 603 and data driver output terminals.

Referring to FIG. 23, as a configuration of a positive polarity output differential amplifier 601, the configuration of the differential amplifier for charging shown in FIG. 1, for example, is employed. As a configuration of a negative polarity output differential amplifier 602, a configuration of the differential amplifier for discharging shown in FIG. 2 is employed.

An inside of the output circuit 603 has a configuration in which the positive polarity output differential amplifier 601 alternate with the negative polarity output differential amplifier 602 for each data line.

When a liquid crystal display device is driven, it is a common practice to alternately apply voltages of a positive polarity and a negative polarity to liquid crystals for every output period, in view of extension of a longer life of the liquid crystals. Further, in order to visually counterbalance imbalance among the voltages applied to the liquid crystals within a liquid crystal panel, a dot inversion driving method is generally employed in which for every adjacent pixels (for every adjacent data lines), voltages of the positive polarity and the negative polarity are alternately applied.

In order to alternately apply voltages of the positive and negative polarities for the above-mentioned reason, the amplifiers 601 and the amplifiers 602 are alternately arranged in the present embodiment.

The output switch circuit 604 is composed of a plurality of groups of four switches constituted from switches Spa, Spb, Sna, and Snb, connected between output terminals of the two differential amplifiers (601, 602) of both of the polarities and data driver output terminals 210. The switches Spa and Spb are the switches constituted from P-channel transistors, and the switches Sna and Snb are the switches constituted from N-channel transistors.

Next, an operation of the data driver of the display device in FIG. 23 will be described with reference to the timing chart in FIG. 24. The description will be given, assuming that the dot inversion driving method is used as a polarity inversion driving method of a voltage to be applied to a data line.

As control signals shown in FIG. 24, signals CTL1 and CTL2 for controlling output switches are added, in addition to the control signals for the switches S1 to S5 shown in FIG. 3.

The output switch control signals CTL1 and CTL2 repeat the following four phases periodically.

In a first phase (from a time T1 to a time Ta12 in FIG. 24), the signal CTL2 goes LOW at the time T1, and both of the signals CTL1 and CTL2 go LOW in this period. With this arrangement, the switches Spa, Spb, Sna, and Snb are all turned off.

In a second phase (from the time Ta12 to a time T2 in FIG. 24), the signal CTL1 goes HIGH at the time Ta12, and the signal CTL2 remains LOW. With this arrangement, the switches Spa and Sna are turned on, and the switches Spb and Snb are set in an OFF state.

In a third phase (from the time T2 to a time Ta23 in FIG. 24), the signal CT11 goes LOW at the time T2, and both of the signals CTL1 and CTL2 go LOW in this period. With this arrangement, the switches Spa, Spb, Sna, and Snb are all turned off.

In a fourth phase (from the time Ta23 to a time T3 in FIG. 24), the signal CTL2 goes HIGH at the time Ta23, and the signal CTL1 remains LOW. With this arrangement, the switches Spb and Snb are turned on, and the switches Spa and Sna are set in an OFF state.

By repeating the first phase through the fourth phase periodically, connecting relationships among the output terminals of the differential amplifiers (601, 602) and the data driver output terminals (OUT1 to OUTn) are determined.

In the first and third phases, the output terminals of the differential amplifiers (601 and 602) and the data driver output terminals (OUT1 to OUTn) are disconnected. In FIG. 24, these periods just overlap with the offset detection periods T01.

This is because, since the offset detection period T01 does not substantially contribute to driving an external load (such as an liquid crystal and a data line), all of the output switches (Spa, Spb, Sna, and Snb) are turned off during this period, thereby getting an effect in which the amplifiers block excessive currents that flow through the external load during the offset detection period.

In the second phase, the positive polarity output differential amplifiers (601) are connected to the odd-numbered data driver output terminals (OUT1, OUT3, OUT5, and the like), and the negative polarity output differential amplifiers (602) are connected to the even-numbered data driver output terminals (OUT2, OUT4, OUT6, and the like).

In the fourth phase, the positive polarity output differential amplifiers (601) are connected to the even-numbered data driver output terminals (OUT2, OUT4, OUT6, and the like), and the negative polarity output differential amplifiers (602) are connected to the odd-numbered data driver output terminals (OUT1, OUT3, OUT5, and the like).

At the time Ta12 when the second phase is started and at the time Ta23 when the fourth phase is started, the offset voltage (Voff) and a level-shifted voltage (Vin2−Vin1) are held in the capacitor Coff within each of the differential amplifiers (601 and 602), a high-accuracy, level-shifted voltage is output in each of the second and fourth phases.

Accordingly, when the data driver of the display device in the present embodiment is employed, the output switches (Spa, Spb, Sna, and Snb) are set in an OFF state during the offset detection period T01. Thus, a flow of excessive charges to the external load from the output terminals of the amplifiers during the offset detection period can be prevented. Further, compared with a configuration referred to as a Rail-to-rail amplifier (not shown) in which a differential pair of P-channel transistors and a differential pair of N-channel transistors are included in one amplifier, the number of the capacitances Coff can be reduced in the present invention. That is, in the case of the Rail-to-Rail amplifier, two load circuits of mutually different conductivity types are included in one amplifier.

Thus, two capacitances are necessary. In the present embodiment, the positive differential amplifiers (601) and the negative differential amplifiers (602) are alternately arranged. Thus, one capacitor Coff per amplifier suffices.

Further, since multi-level output with high accuracy can be performed, the number of gray scale lines and transistors to be selected can be reduced more in the decoders 605 of the present invention than in conventional decoders 203. The area of the digital-to-analog converter thus can be saved.

The above description was given about the embodiments and the specific embodiment examples of the present invention. Incidentally, the present invention may of course combine characteristics of the configurations of the differential amplifiers in the first to fifth embodiments as necessary. Further, the present invention is not limited to the configurations of the embodiments described above and may of course include various variations and modifications that could be made by those skilled in art within a scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:
   first and second input terminals and an output terminal;
   a differential pair having a pair of inputs thereof connected to said first terminal and said second input terminal, respectively, said differential pair for performing voltage-to-current conversion of voltages at said first and second input terminals to output differential currents to first and second nodes, respectively;
   a first current source for supplying a current to said differential pair;
   a first load circuit connected to said first node, said first load circuit for performing current-to-voltage conversion of a current at said first node to a voltage at a third node;
   a second load circuit connected to said second node, said second load circuit for reversibly performing mutual conversion between a current at said second node and a voltage at a fourth node and for supplying a voltage signal to a fifth node;
   a capacitance element connected between said third node and said fourth node; and
   an amplifier circuit for charging or discharging said output terminal based on the voltage signal at said fifth node; wherein
   responsive to a control signal, said differential amplifier is subjected to switching control between first and second states, wherein
   in said first state,
   a first signal is supplied to said first input terminal,
   a second signal is supplied to said second input terminal, and
   a potential difference between the voltages at said third and fourth nodes output by said first and second load circuits, respectively, are stored in said capacitance element; and wherein
   in said second state,
   a third signal is supplied to said second input terminal,
   a signal at said output terminal is fed back to said first input terminal, and
   the potential difference stored in said capacitance element in said first state is held and a voltage signal is output to said fifth node based on the potential difference.

2. A differential amplifier comprising:
   first and second input terminals and an output terminal;
   a differential pair having a pair of inputs thereof connected to said first terminal and said second input terminal, respectively, said differential pair for performing voltage-to-current conversion of voltages at said first and second input terminals to output differential currents to first and second nodes, respectively;
   a first current source for supplying a current to said differential pair;
   a first load circuit connected to said first node, said first load circuit for performing current-to-voltage conversion of a current at said first node to a voltage at a third node;
   a second load circuit connected to said second node, said second load circuit for reversibly performing mutual conversion between a current at said second node and a voltage at a fourth node and for supplying a voltage signal to a fifth node;
   a capacitance element connected between said third node and said fourth node; and
   an amplifier circuit for charging or discharging said output terminal based on the voltage signal at said fifth node; wherein
   a data output period of said differential amplifier includes first and second periods and responsive to a control signal, switching control between said first period and said second period is performed, wherein
   in said first period,
   a first signal is supplied to said first input terminal of said differential pair through a fourth switch in an on state;
   a second signal is supplied to said second input terminal of said differential pair through a second switch in the on state;
   said second and fourth nodes are short-circuited by a first switch in the on state; and
   a potential difference between said third and fourth nodes is stored in said capacitance element; and wherein
   in said second state,
   said first, second, and fourth switches are all turned off,
   said output terminal is feedback connected to said first input terminal of said differential pair through a fifth switch in the on state, and
   a third signal is supplied to said second input terminal of said differential pair through a third switch in the on state.

3. The differential amplifier according to claim 1, wherein said third signal is identical with said first signal.

4. The differential amplifier according to claim 2, wherein said third signal is identical with said first signal.

5. The differential amplifier according to claim 1, wherein
   said first load circuit includes a first transistor and said second load circuit includes a second transistor;
   a drain of said first transistor is connected to said first node;
   a gate of said first transistor is connected to said third node;
   a drain of said second transistor is connected to said second and fifth nodes;
   a gate of said second transistor is connected to said fourth node;
   said gate of said first transistor and said drain of said first transistor are short-circuited;
   said gate of said second transistor and said drain of said second transistor are connected or interrupted; and said first and second transistors constitute a current mirror load circuit, and amplification and output are performed based on the voltage signal at said fifth node.

6. The differential amplifier according to claim 1, wherein
said first load circuit includes first and fifth transistors and said second load circuit includes second and sixth transistors;
a drain of said fifth transistor is connected to said first node;
a gate of said first transistor is connected to said third node;
a drain of said sixth transistor is connected to said second node;
a gate of said second transistor is connected to said fourth node;
a drain of said second transistor and a source of said sixth transistor are connected to said fifth node;
a gate of said first transistor and said drain of said fifth transistor are short-circuited;
a drain of said first transistor and a source of said fifth transistor are short-circuited;
said gate of said second transistor and said drain of said sixth transistor are connected or interrupted by the control signals; and
said first, second, fifth, and sixth transistors constitute a cascode-type current mirror load circuit, and amplification for output are performed based on the voltage signal at said fifth node.

7. The differential amplifier according to claim 2, wherein
said first switch comprises a third transistor and
said differential amplifier comprises a fourth transistor with a drain thereof and with a source thereof short-circuited, said fourth transistor arranged between said third transistor and said fourth node; wherein
a first control signal is supplied to a gate of said third transistor,
a second control signal is supplied to a gate of a fourth transistor, and
the second control signal is an inverted signal of the first control signal.

8. The differential amplifier according to claim 1, comprising:
a second current source and a sixth switch connected in parallel with said first current source.

9. The differential amplifier according to claim 8, wherein said sixth switch is set in an ON state during said first period and is set in an OFF state during said second period.

10. The differential amplifier according to claim 1, wherein output switches are provided between said output terminal of said differential amplifier and an external load.

11. The differential amplifier according to claim 10, wherein
said output switches are set in an OFF state during said first period; and
said output switches are set in an ON state during said second period.

12. A digital-to-analog conversion circuit comprising:
the differential amplifier as set fourth in claim 1;
a resistor array connected in series between a higher first potential and a lower second potential; and
a selection circuit for receiving voltages at taps of said resistor array and selecting voltages to be supplied to the first, second, and third signals, respectively, based on a selection signal.

13. A display device including amplifier circuits each for receiving a gray scale voltage and driving a data line connected to a display element, wherein each of said amplifier circuits includes:
the differential amplifier as set fourth in claim 1.

14. The display device according to claim 13, wherein the data line comprises a plurality of data lines, said data lines including first data lines and second data lines adjacent to said first data lines respectively; and
said display device comprises a plurality of said differential amplifiers including first differential amplifiers for charging and second differential amplifiers for discharging;
first output switches respectively provided between each of said first differential amplifiers and each of said first data lines;
second output switches respectively provided between each of said first differential amplifiers and each of said second data lines;
third output switches respectively provided between each of said second differential amplifiers and each of said first data lines; and
fourth output switches respectively provided between each of said second differential amplifiers and each of said second data lines; wherein
during a predetermined data output period, said second and third output switches are set in an OFF state and said first and fourth output switches are set in an ON state; and
during a data output period subsequent to the predetermined data output period, said first and fourth output switches are set in an OFF state and said second and third output switches are set in an ON state.

15. The display device according to claim 13, wherein
the data line comprises a plurality of data lines, and said data lines includes first data lines and second data lines adjacent to said first data lines, respectively; and
said display device comprises a plurality of said differential amplifiers including first differential amplifiers for charging and second differential amplifiers for discharging;
first output switches respectively provided between each of said first differential amplifiers and each of said first data lines;
second output switches respectively provided between each of said first differential amplifiers and each of said second data lines;
third output switches respectively provided between each of said second differential amplifiers and each of said first data lines; and
fourth output switches respectively provided between each of said second differential amplifiers and each of said second data lines; wherein
control is performed so that during a predetermined data output period, said second and third output switches are set in an OFF state, and said first and fourth output switches are turned on after having been set in an OFF state during a predetermined period from a start of the data output period; and
during a data output period subsequent to the predetermined data output period, said first and fourth output switches are set in an OFF state, and said second and third output switches are turned on after having been set in an OFF state during the predetermined period after a start of the data output period.

16. A differential amplifier comprising:
first through third input terminals and an output terminal;
a load circuit including: a first transistor with a first end thereof connected to a first power supply; a second transistor with a first end thereof connected to said first power supply; and a capacitor connected between a control terminal of said first transistor and a control terminal of said second transistor;

a differential pair including third and fourth transistors with first ends thereof connected in common and with second ends thereof connected to second ends of said first and second transistors, respectively;

a control terminal of said first transistor being connected to the second terminal of said third transistor;

a current source connected between a second power supply and the commonly coupled first ends of said third and fourth transistors, said current source for supplying a current to said differential pair;

a first switch connected between said control terminal of said second transistor and the second end of said fourth transistor;

an amplifier with an input thereof connected to the second end of said second transistor and an output thereof connected to said output terminal;

a second switch connected between a control terminal of said fourth transistor and said first input terminal and a third switch connected between said control terminal of said fourth transistor and said third input terminal;

a fourth switch connected between a control terminal of said third transistor and said second input terminal; and a fifth switch connected between said control terminal of said third transistor and said output terminal;

said control terminal of said first transistor being connected to the second end of said third transistor;

said first through fifth switches being subject to switching control between a first state and a second state, wherein in said first state, said first, second, and fourth switches are set in an ON state and said third and fifth switches are set in an OFF state; and in said second state, said first, second, fourth switches being set in an OFF state and said third and fifth switches being set in an ON state.

17. The differential amplifier according to claim 16, wherein said third input terminal is identical with said second input terminal.

18. The differential amplifier according to claim 16, wherein said load circuit includes fifth and sixth transistors cascode-connected to said first and second transistors, respectively, and said fifth and sixth transistor are connected to the second ends of said third and fourth transistors, respectively.

19. The differential amplifier according to claim 16, comprising a sixth switch provided between said control terminal of said second transistor and the second end of said fourth transistor, said sixth switch being subject to on/off control by a control terminal thereof and having first and second ends short-circuited, said sixth switch being connected in series with said first switch.

20. The differential amplifier according to claim 16, comprising a series circuit provided between said second current source and the commonly coupled first ends of said third and fourth transistor, in parallel with said current source, said series circuit comprising a second current source and a switch.

* * * * *